US005689572A

United States Patent [19]

Ohki et al.

[11] Patent Number: 5,689,572

[45] Date of Patent: Nov. 18, 1997

[54] METHOD OF ACTIVELY CONTROLLING NOISE, AND APPARATUS THEREOF

[75] Inventors: Katsuo Ohki; Shinichi Shimode, both of Ibaraki-ken; Yukiji Iwase, Ushiku; Osamu Sekiguchi, Ryugasaki; Masanori Watanabe, Ibaraki-ken; Takahiro Daikoku, Ushiku; Tamotsu Tsukaguchi, Hiratsuka; Shigeru Koizumi, Hadano, all of Japan

[73] Assignee: Hitachi, Ltd., Tokyo, Japan

[21] Appl. No.: 352,230

[22] Filed: Dec. 8, 1994

[30] Foreign Application Priority Data

| | | | |
|---|---|---|---|
| Dec. 8, 1993 | [JP] | Japan | 5-308022 |
| Dec. 17, 1993 | [JP] | Japan | 5-317563 |

[51] Int. Cl.[6] .......... H03B 29/00

[52] U.S. Cl. .......... 381/71.3; 381/71.4; 381/94.1

[58] Field of Search .......... 381/71, 94

[56] References Cited

U.S. PATENT DOCUMENTS

| | | | |
|---|---|---|---|
| 4,589,137 | 5/1986 | Miller | 381/71 |
| 4,677,676 | 6/1987 | Eriksson et al. | 381/71 |
| 5,022,082 | 6/1991 | Eriksson et al. | 381/71 |
| 5,278,780 | 1/1994 | Eguchi | 381/71 |
| 5,384,853 | 1/1995 | Kinoshita et al. | 381/71 |

FOREIGN PATENT DOCUMENTS

| | | | |
|---|---|---|---|
| 0013997 | 1/1991 | Japan | 381/71 |
| 0188976 | 7/1993 | Japan | 381/94 |
| 0232973 | 9/1993 | Japan . | |

*Primary Examiner*—Curtis Kuntz

*Assistant Examiner*—Duc Nguyen

*Attorney, Agent, or Firm*—Antonelli, Terry, Stout & Kraus, LLP

[57] ABSTRACT

In an active noise-reduction controlling apparatus, there are provided a reference sensor for outputting a reference signal corresponding to information about a noise source, a noise-reduction error sensor for detecting a noise-reduction condition, an adding acoustic wave source controlled to produce an acoustic wave having the same amplitude as that of an acoustic wave received at the noise-reduction error sensor and having a phase opposite to that of the acoustic wave received as the noise-reduction error sensor; a first adaptive digital filter for processing the reference signal to output a control signal of the adding acoustic wave source, a second adaptive digital filter for setting a predicted value of a transfer function between an input signal of the adding acoustic wave source and an output signal of said noise-reduction error sensor, a filter coefficient controlling unit for optimizing a coefficient of the first adaptive digital filter with employment of the predicted value of the transfer function and the output of the noise-reduction error sensor, and a control unit for correcting the predicted value of the transfer function in accordance with an environmental change.

44 Claims, 25 Drawing Sheets

METHOD OF ACTIVELY CONTROLLING NOISE, AND APPARATUS THEREOF

BACKGROUND OF THE INVENTION

The present invention relates to a method for actively-controlling noise and to an apparatus for performing this active-control method. The invention, for instance, concerns an active noise control for reducing noises produced within automobiles and also noises produced from electric appliances such as air conditioners and computers.

A description will now be made of conventional active noise-reduction controlling methods and apparatus.

Methods for reducing or lowering noises within an automobile, and also noises produced from electronic appliances such as an air conditioner and a computer, include such active noise controlling techniques as adding an artificially produced secondary acoustic wave having the same amplitude as that of the acoustic wave from the noise source and having a phase opposite to that of the acoustic wave from the noise source so that the noises are actively reduced by utilizing interference of the waves.

A noise controlling method by way of active noise control is achieved by the LMS (least mean square) algorithm (see JP-A-1-501344). Since the LMS algorithm owns great generic utilization, most of recent research concerning active noise control has employed this LMS algorithm.

In noise control on the basis of the LMS algorithm, before commencing the noise reduction operation, the value of the transfer function between the input signal to the speaker, functioning as the adding acoustic wave source, and the output signal of the error microphone, functioning as a noise-reduction (noise-cancelling) error sensor at the place where the noises are to be reduced, is predicted and stored. This transfer function may be predicted based on calculation values and experimental values obtained during the designing stages of the noise control apparatus, or it may be obtained during adjustment work in assembling the noise control apparatus. Then, while performing the noise-reduction operation, the reference signal corresponding to the information of the noise source is produced, and this reference signal is supplied through an adaptive digital filter to the speaker, thereby producing the added acoustic waves. In this case, while the convolution value, obtained from this reference signal and the previously predicted value of this transfer function, is calculated as the virtual input signal, the coefficient "W" of the adaptive digital filter is sequentially updated by using both this virtual input signal and the output signal from the error microphone in accordance with the LMS algorithm in such a manner that squared value of the output signal from the error microphone can be minimized, so that the noise level at the position of the error microphone is lowered. The finite in pulse response characteristic (FIR) type digital filters are employed in the transfer function predicting unit and the adaptive digital filter.

Considering the transfer function between the input signal of the speaker and the output signal of the microphone in such a conventional active noise-reduction controlling apparatus, this transfer function is previously obtained as the predicted value before the noise reduction operation is commenced. During the noise-reduction operation, since this predicted value of the transfer function is fixedly utilized to perform the control process, when an environmental change happens to occur, for instance, a temperature change happens to occur during the noise-reduction operation, the previously calculated predicted value of the transfer function would be deviated from the actual value (namely true value) of the transfer function. While this deviation is small, the coefficient "W" of the adaptive digital filter is updated in accordance with the adaptive algorithm so as to compensate for this deviation, but if this deviation becomes large, then the deviation can be no longer compensated, since loads given to the adaptive algorithm would be increased. Accordingly, the noise-reduction effects would be deteriorated.

When the calculation is executed by employing all of the taps of an adaptive digital filter to represent a predicted value of the transfer function while the convolution calculation is carried out for the reference signal corresponding to the information of the noise source, and also the predicted value of the transfer function between the input signal of the speaker and the output signal of the error microphone, if the total number of speakers is increased, then this calculation amount would be considerably increased. As a consequence, adaptivity would be deteriorated, and thus the noise-reduction effect would be lowered.

Furthermore, JP-A-3-13997 discloses such a duct system with employment of the above-described active noise-reduction controlling apparatus. In this duct system, in order to improve the noise-reduction frequency characteristic, a halfway portion of the duct is subdivided into a plurality of acoustic wave propagation paths, both the reference sensor and the speaker are provided in the respective acoustic wave propagation paths, and an error microphone is commonly provided within the duct at the place succeeding to the combined acoustic wave propagation paths as a single propagation path.

However, since this conventional duct system is so arranged that both the reference sensor and the speaker are installed within the acoustic wave propagation paths formed by subdividing the duct path, when such a duct system is employed in an electric appliance whose duct path is short, these reference sensors and speakers should be located close to each other, resulting in difficulty in control. Moreover, since the error microphone is commonly provided at the acoustic wave combined position located in a plurality of acoustic wave propagation paths arranged by subdividing the duct path, the detection error would become large in such an electronic appliance equipped with a duct path having a large cross-sectional area. As a result, the precision of the noise reduction would be lowered, and thus the noise-reduction effect would be deteriorated.

In addition, there is another conventional active noise-reduction controlling apparatus, as described in JP-A-5-232973, in which an acoustic wave having the same amplitude as that of the noise produced from an air-cooling wind blower and having its phase shifted by 180 degrees from that of this noise wave is applied to interfere with the noise wave so as to reduce the noise, and the duct functioning as the noise propagation path is arranged along the inner surface of the housing.

In this conventional active noise-reduction controlling apparatus, the duct is installed along the inner well of the outer plate of the housing, or is formed in a loop shape in order that the propagation time, defined by the noise produced from the noise source and propagated through the duct and thereafter reaches the opening port of the duct, can be made longer than the processing time executed in this active noise-reduction controlling apparatus. However, this conventional active noise-reduction controlling apparatus neither describes nor teaches that noises caused by such a high wind power cooling blower can be effectively reduced or canceled.

In general, a noise reducing (canceling) amount in an active noise-reduction controlling apparatus is increased in accordance with correlation between the noise to be canceled and a reference signal, namely in proportion to the magnitude of coherence. On the other hand, it is apparent that a higher noise-canceling amount could be achieved if a reference sensor could sense such a signal which is produced in such a way that noises are radiated from a plurality of noise sources and propagated, and thereafter these propagated noises are mixed with each other. However, in case of the air cooling type electronic apparatus, a plurality of blower noises are propagated through the heating board group arranged by a plurality of heating boards arranged in a substantially parallel form, and the acoustic waves radiated from the respective acoustic wave source are insufficiently mixed with each other because of these heating boards. As a consequence, coherence would become small and the sufficient noise canceling effects could not be achieved.

Moreover, since the signal processing speed of the analog signal processing system is considerably higher than that of the digital circuit, the resultant active noise-reduction controlling apparatus with employment of such an analog signal processing method can be made compact. To the contrary, this analog signal processing type noise-reduction controlling apparatus has another problem in that the noise-reduction performance would be deteriorated, and also unstable analog signal processing operation would be induced because of changes in the acoustic propagation speeds caused by the cooling air temperatures, and also aging effects of the sensor and speaker.

SUMMARY OF THE INVENTION

An object of the present invention is to provide a control method and a control apparatus capable of preventing divergence and lowering of noise-reduction effects caused by an environmental change during the noise-reduction operation.

Another object of the present invention is to provide a control method and a control apparatus capable of reducing the calculation amount required to process a signal, while maintaining the necessary noise-reduction effects.

Another object of the present invention is to provide an active noise-reduction controlling apparatus capable of improving the noise-reduction effects in an air duct having a relatively large area.

A further object of the present invention is to provide such an electronic apparatus mounting an active noise-reduction controlling apparatus. That is, in an air cooling type compact electronic apparatus requiring heat exchange by using a large amount of cooling wind, with respect to the air cooling wind noises produced from a plurality of air blowers and leaked out from the housing of this electronic apparatus or aerodynamic noise produced at a board which generates heat, the adding acoustic waves outputted from the speakers provided in a plurality of short propagation paths are applied through these short propagation paths to these wind noises, so that destructive interference could occur between these noises and adding acoustic waves, and thus the noises could be reduced or canceled with high efficiency.

A still further object of the present invention is to provide an electronic apparatus mounting an active noise-reduction controlling apparatus capable of improving deterioration of the noise-reduction performance and unstable characteristics, while maintaining the various merits of the analog signal processing method, i.e., compactness at low cost, since no noise-reduction error sensors are required if the transfer function is determined.

In accordance with the present invention, the predicted value of the transfer function is varied during the noise-reduction operation, and this predicted value is employed in the calculation process required to control the production of the adding acoustic wave which is used to interfere with the acoustic wave (noise) generated from the noise source so as to reduce the noise, so that lowering of the noise-reduction effects caused by the environmental change can be avoided.

It should be noted that the above-described predicted value implies a value calculated based on the actual measurement value, approximated to the true value.

Concretely speaking, when deviation happens to occur between the true value and the predicted value of the transfer function, the predicted value of the transfer function is changed. This change may be realized by either correcting the predicted value, or selectively using a plurality of values previously prepared based on the predetermined selection basis.

Also, a threshold value is provided with respect to the amplitude of the predicted value of the transfer function, and such a calculation process that only the taps of the adaptive digital filter corresponding to the amplitude exceeding this threshold value are made valid is carried out, so that the production of the adding acoustic wave is controlled. Then, when the noise-reduction effect is lowered, this threshold value is reduced according to necessity to increase the valid tap quantity used in the control.

According to the present invention, since the predicted values of the transfer function which have been previously predicted and set are amended or selectively utilized in response to the environmental changes, lowering of the noise-reduction effect caused by such an environmental change can be prevented.

Also, in accordance with the present invention, there are employed a reference sensor for sensing a noise; a speaker provided in an air duct, for reducing the noise; a noise-reduction error sensor for sensing a noise reduction condition; and a signal processing unit for adaptively controlling a speaker input signal based on the information derived from the reference sensor and the noise-reduction error sensor. This air duct unit is segmented into a plurality of acoustic wave propagation paths arranged in a parallel manner. Both the speaker and the noise-reduction error sensor are provided in each of the plural acoustic wave propagation paths. Then, the signal processing unit adaptively controls the respective speaker input signals based upon the output signals from the reference sensor and the noise-reduction error sensor.

Furthermore, according to the present invention, in a case in which the above-described air duct unit is subdivided into a plurality of acoustic wave propagation paths arranged in a parallel manner, a speaker is provided in each of the adjacent acoustic wave propagation paths, and a noise-reduction error sensor is provided in each of the plural acoustic wave propagation paths, whereby the speaker input signal is adaptively-controlled by the signal processing unit based upon the output signals derived from the reference sensor and the noise-reduction error sensor.

In addition, according to the present invention, when the air duct unit is divided into a plurality of acoustic wave propagation units arranged in a parallel manner, the reference sensor is commonly employed in front of, or behind the object to be cooled, and both the noise-reduction error sensor and the speaker are provided in each of these acoustic wave propagation paths.

Moreover, according to the present invention, an active noise-reduction controlling apparatus is constructed of a heating board group arranged of a plurality of heating boards which are aligned in a substantially parallel manner; an air blower for cooling the heating board group; a housing for storing the heating board group and the air blower; a reference sensor capable of sensing information about noises produced from the air cooling operation, e.g., blower's noise; a speaker for producing a sound; and also a noise reduction signal producing controller for driving the speaker in response to the signal derived from the reference sensor. A plurality of sound propagation paths are provided in at least one of the input port and the output port of the housing, the speakers are provided for the respective sound propagation paths, and further a mixing propagation path is employed which functions as an area used to mix the acoustic waves with each other between either the input port or the output port of this housing, and the plural sound propagation paths.

The number of these mixing propagation paths is equal to that of the air blowers arranged along a direction substantially the same as the direction along which the heating board is arranged, whereas the reference sensor is provided in each of the mixing propagation paths. Also, a phase filter having a gain of one and capable of shifting only the phase is provided between the reference sensor and the controller. A noise-reduction error sensor is provided so as to sense errors present after the noise canceling operation, a phase calculation unit is employed to calculate a phase delay from the output signal of the noise-reduction error sensor, and further a signal processing unit capable of changing the phase delay in response to this phase calculation signal is provided.

The vibrating plane of the speaker, the reference sensor, or the noise-reduction error sensor are covered with a material through which acoustic waves can pass and substantially no cooling air can pass. Furthermore, a flat type speaker is employed as the above-described speaker. Among these sound propagation paths, a bending portion is formed between the speaker and the reference sensor. Also, a mesh is inserted into a halfway portion of the acoustic wave propagation path so as to make a uniform wind speed distribution. In this bending portion, a change in the curvature of the inner surface of the bending portion is gradually varied in a smooth manner, so that reflections of the acoustic waves from these smooth surface can be reduced. A straightening vane is provided in this bending portion to lower the maximum wind speed.

As the reference signal constituting the input signals to the speakers which are provided at each of the plural propagation paths, the output signal derived from the reference sensor is employed which is located on the acoustic wave propagation path and separated from the speaker by the shortest distance. Also, a switched capacitor filter capable of compensating for the phase delay is employed as the phase filter.

With the above-described arrangements, the blower's noises produced from the heating board group stored in the housing and also the air blower for cooling this heating board group are propagated through the mixing propagation path and a plurality of sound propagation paths and thereafter are blown out of the housing. At this time, the information about the above-described plural noises is sensed by the reference sensor provided in the mixing propagation path, the noise reduction signal is produced based on the signal outputted from the reference sensor by the controller, and the acoustic wave or sound is produced from the speakers provided in the plural sound propagation paths in accordance with the noise-reduction signal outputted from the controller, whereby these noises can be actively reduced or canceled.

When the analog control system is employed, the signal detected by the reference sensor is directly outputted from the speaker, while the phase thereof is inverted. To the contrary, when the digital control system is employed, the reference signal from the reference sensor is convolution-calculated with the previously measured transfer function, thereby producing the noise-reduction signal.

Since the phase filter is employed, an arbitrary phase delay is given to the signal derived from the reference sensor, and then these noises can be actively reduced or canceled by the analog control type active noise-reduction controlling apparatus.

The phase delay is calculated from the output signal of the noise-reduction error sensor by the phase calculation unit, and at least the phase delay of the phase filter can be compensated by the signal processing unit based on the signal outputted from the phase detecting unit.

The following various advantages can be obtained in accordance with the present invention.

That is, according to the present invention, the predicted value of the transfer function is varied during the noise-reduction operation, and this predicted value is used in such a calculation process for controlling the production of the adding acoustic wave which interferes with the acoustic wave produced from the noise source, thereby reducing the noises. Since lowering of such a noise-reduction effect due to the environmental change is prevented, such a control capable of being applicable to the environments can be achieved.

Concretely speaking, divergence and lowering of the noise-reduction effects can be prevented which are caused by the change in the true value of the transfer function in connection with the environmental change occurring during the noise-reduction operation. Also, it is possible to reduce the calculation amount required to process the signal, while maintaining the necessary noise-reduction effects by using only the effectively operated predicted value of the transfer function.

Furthermore, according to the present invention, since the acoustic waves produced from the noise source are propagated through a plurality of sound propagation paths formed in either the air duct unit or the air exhaust unit in a parallel manner, and also both the noise-reduction error sensor and the speaker for producing the noise-reduction adding acoustic waves are employed in the respective sound propagation paths in order that the acoustic waves propagated through these sound propagation paths are actively reduced or cancelled, the noise-reduction error sensor can correctly sense the noise-reduction errors within the respective sound propagation paths, and also the signal processing unit can correctly control the speakers provided in the respective sound propagation paths. As a consequence, higher noise-reduction effects can be achieved.

Accordingly, the noise-reduction effects can be similarly increased even in such an air duct path having a relatively short length and a relatively large area.

Further, the electronic apparatus equipped with the active noise-reduction controlling apparatus according to the present invention can provide quiet environments.

In addition, according to the present invention, since such a signal can be inputted to the reference sensor, which has high coherence with the blower's noises produced from a plurality of air cooling blowers and leaked out from the electronic apparatus, the total number of reference sensor can be reduced as much as possible. As a consequence, since the calculation amount can be lowered, the lengths of these plural propagation paths can be made short, so that the active noise-reduction controlling apparatus can be made compact with stable noise reduction at high efficiency.

DESCRIPTION OF THE PREFERRED EMBODIMENTS

Figure 1:
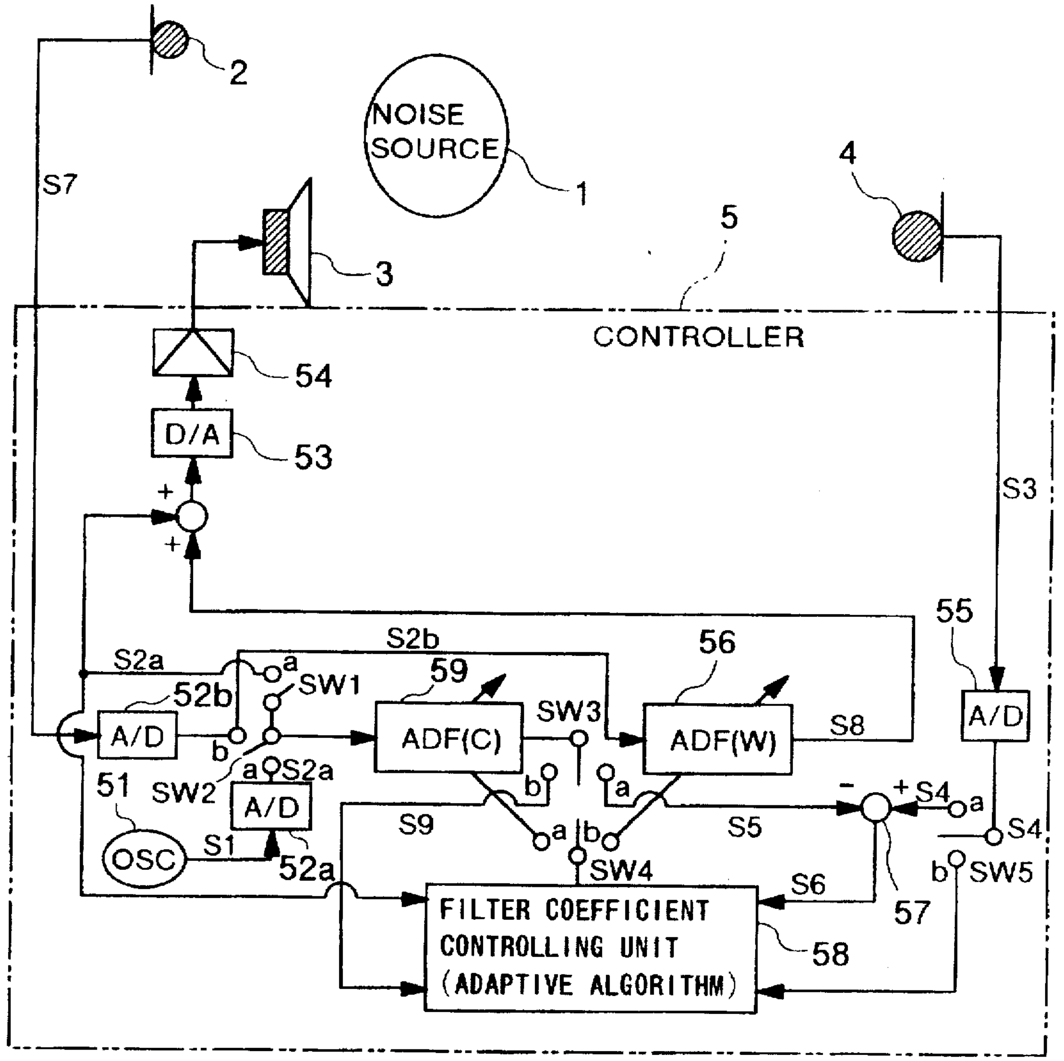
FIG. 1 is a schematic diagram representing an active noise-reduction controlling circuit according to an embodiment of the present invention.

FIG. 1 is a schematic block diagram indicating an overall arrangement of an active noise-reduction controlling apparatus according to an embodiment of the present invention.

The active noise-reduction controlling apparatus shown in FIG. 1 comprises a reference sensor 2 for sensing noise source information of a vibration pickup to acquire vibration information of a noise source 1 and of a current sensor; a speaker 3 functioning as an adding sound source for producing an acoustic wave (adding acoustic wave) based on the signal derived from the reference sensor 2 in order to minimize a signal detected by an error microphone 4; an error microphone 4 provided at a position for reducing noises, and functioning as a noise-reduction error sensor for sensing the acoustic wave from the noise source 1 and the adding acoustic wave from the speaker 3; and a controller 5 for controlling the production of the adding acoustic wave from the speaker 3 in an adaptive control manner in order to reduce the noises at the location of the error microphone 4.

This controller 5 processes a reference signal (noise signal), corresponding to the information about noises obtained by the reference sensor 2, in an adaptive digital filter ADF(W)56 and supplies the processed reference signal to the speaker 3. The controller 5 updates the coefficient (W) of the ADF(W)56, in order to minimize the squared value of the detection signal (sound pressure given to microphone) in accordance with the adaptive algorithm, with employment of both the detection signal of the error microphone 4 and a virtual input signal, whereby the noises may be reduced. This virtual input signal is produced by convolution-calculating both of the reference signal and a predicted value "C" of a transfer function between a previously predicted input signal of the speaker 3 and the output signal of the error microphone 4.

In this case, the value of the transfer function which has been set in a transfer function predicting unit ADF(C)59, constructed of an adaptive digital filter, is corrected to an optimum value in correspondence with environmental variations about changes in the sound propagation paths and changes in acoustic velocities.

Figure 2:
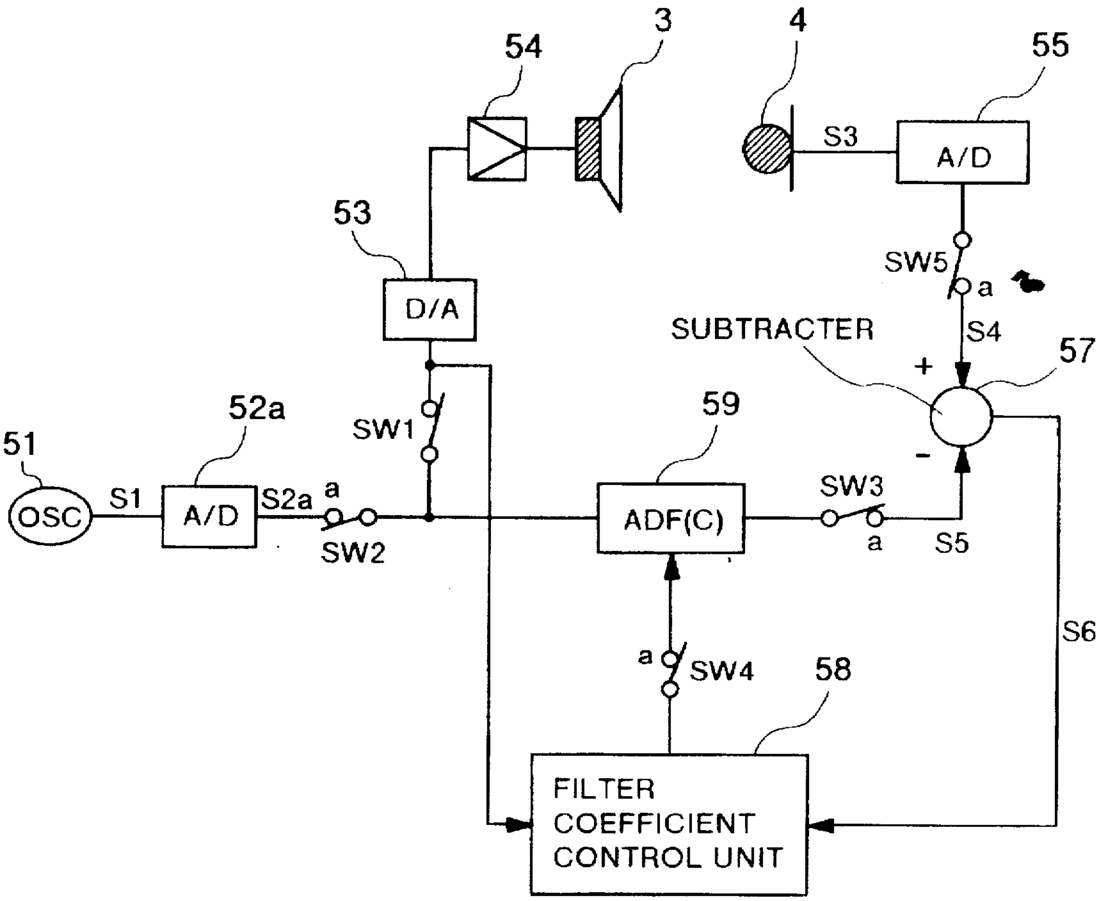
FIG. 2 schematically shows a connection diagram used to calculate a value for predicting a transfer function in the controlling circuit of FIG. 1.

FIG. 2 schematically shows a connection diagram used to obtain predicted values of the transfer function.

As shown in FIG. 2, the controller 5 is comprised of an adding acoustic wave generating unit in which to obtain the predicted value C of the transfer function between the input signal of the speaker 2 and the output signal of the error microphone 4. For this purpose, the contact of switch SW2 is connected to the a-side, a signal S1, irrelevant to the noise and obtained from a noise signal generating source 51, is set to a digitally-formed reference signal S2*a*, such as an M-series (maximum-length linear shift register sequence) signal indicative of a random signal, by an A/D converter 52a, and this reference signal S2a is supplied via switches SW2 and SW1, a D/A converter 53 and a power amplifier 54 to the speaker 3, whereby the adding acoustic waves are produced. This controller 5 further comprises an A/D converter 55 for converting the detection signal S3, being proportional to sound pressure of the acoustic wave received by the microphone 4, into a detection signal S4 having a digital form; the adaptive digital filter ADF(C) 59 for convolution-calculating the reference signal S2a to output the calculation result as a calculation signal S5; and a subtracter 57 for performing a subtracting process between the detecting signal S4 and the calculation signal S5 to obtain a deviation signal S6; and further a filter coefficient control unit 58 for performing a control process to update the coefficient of the ADF(C) 59 in order to minimize the squared value of this deviation signal S6, and having an adaptive algorithm for setting the convergent value as the predicted value C of the transfer function.

Figure 3:
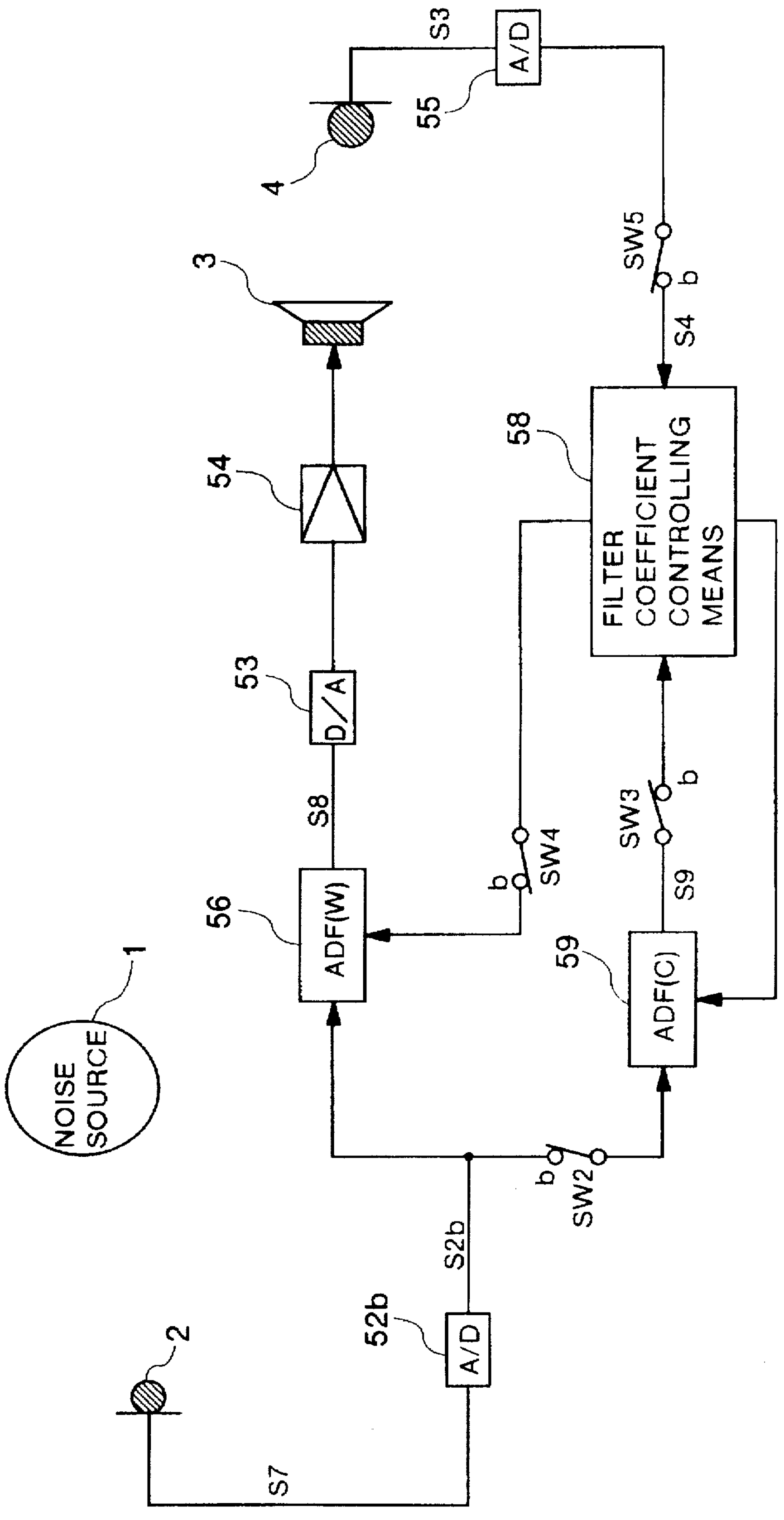
FIG. 3 schematically indicates a connection diagram for performing an active noise reduction in the controlling circuit of FIG. 1.

In addition, as shown in FIG. 3, in order to perform the noise reduction control, the respective switches are switched, and the detection signal S7, outputted from the reference sensor 2 as the information about the noises of the noise source 1, is converted by the A/D converter 52b as a reference signal S2b. Then, this reference signal S2b is convolution-calculated by employing the coefficient of the ADF(W) 56, and thus a speaker control signal S8 for producing an adding acoustic wave to minimize the acoustic wave detected by the error microphone 4 based on the noise from the noise source 1. This speaker control signal S8 is converted into analog signal by the A/D converter 53, amplified by the power amplifier 54, and supplied to the speaker 3. On the other hand, a detection signal S3, detected by the error microphone 4 and corresponding to the sound pressure of the acoustic waves from the noise source 1 and the speaker 3, is converted by the A/D converter 55 to obtain a detection signal S4. The reference signal S2b is inputted into ADF(C)59 in which the predicted valve of transfer function is set and processed with a convolution operation with the predicated valve "C" of the transfer function, so that a virtual input signal S9 is produced. Then, the coefficient (W) of the ADF(W) 56 is continuously updated by the filter coefficient control unit 58 in order that the squared value of the detection signal S4 becomes a minimum in accordance with the adaptive algorithm with employment of this virtual input signal S9 and the detection signal S4.

Furthermore, the filter coefficient control unit 58 includes a change controlling unit for changing the previously predicted and set value of the transfer function in order not to lower or deteriorate the noise reduction effects due to changes in environments during the noise reduction operation. When there are changes in the environmental conditions of the acoustic wave propagating space during the noise reduction operation, since the true value of this transfer function is changed, the predicted value C used in the control calculation is deviated from the actual value. As previously explained, the filter coefficient control unit 58 monitors the noise reduction effects during the noise-reduction controlling operation with employment of the predicted value C of the transfer function, which is previously predicted, and also updates the predicted value C when this noise reduction effect becomes lower than the judging reference value.

It should be noted that in accordance with the above described conventional LMS controlling method, the ADF (W) 56 is operated as an adaptive digital filter during the noise reduction operation and the ADF(C) 59 is fixed, whereas the ADF(W) 56 is not used during the transfer function predicting operation, but the ADF(C) 59 is operated as an adaptive digital filter. In accordance with the present invention, the setting value "C" of the ADF(C) 59 is also varied in response to the temperature.

Figure 4:
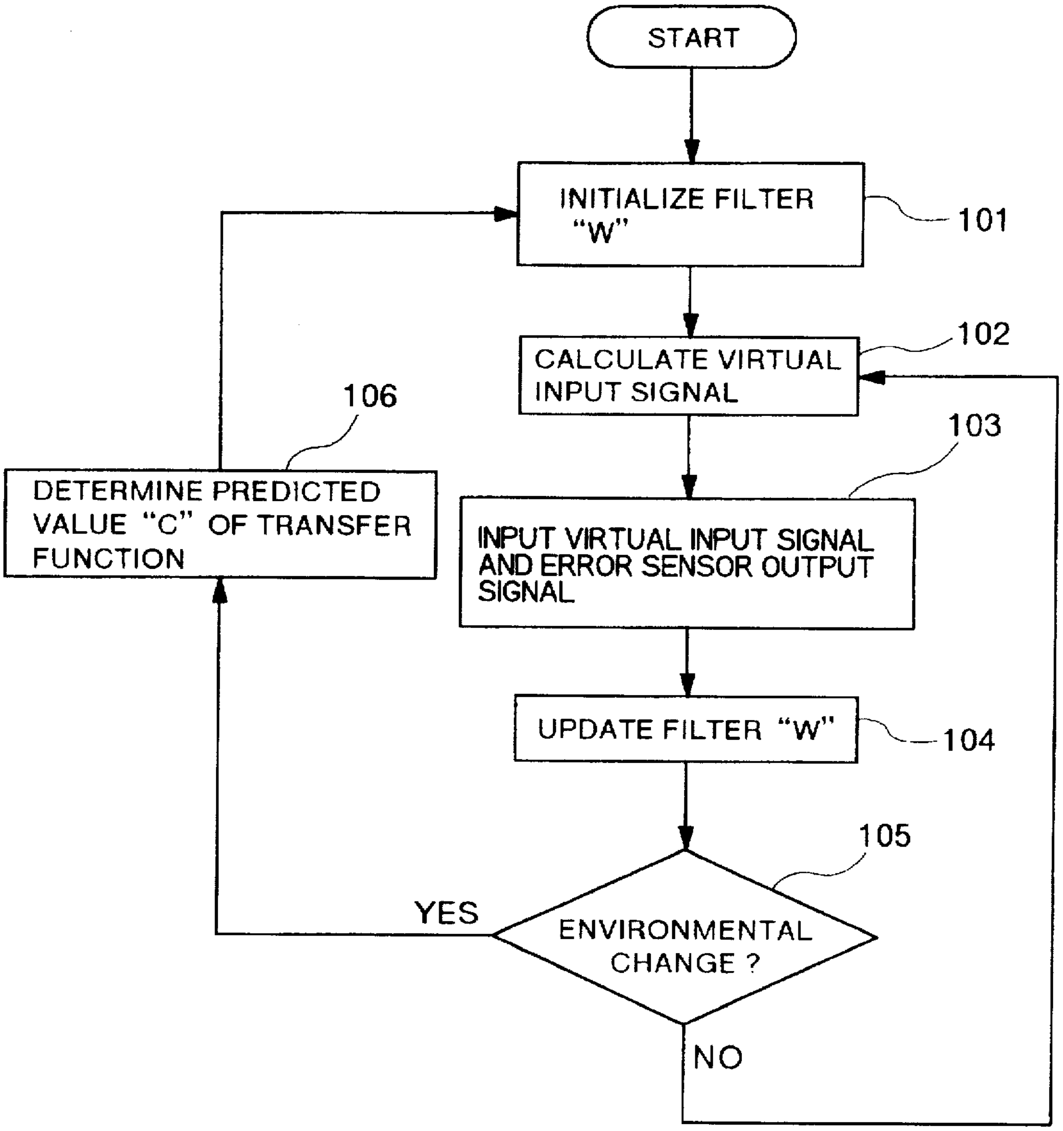
FIG. 4 is a flow chart for representing one embodiment in which the predicted value of the transfer function is updated.

FIG. 4 and FIG. 5 are flow charts for a control process operation to set the predicted value "C" of the transfer function of the ADF(C) S9, to produce the adding acoustic waves, and to change the predicted value "C" of the transfer function.

FIG. 4 is a flow chart for an updating process of the predicted value "C" of the transfer function in response to environmental variations, according to one embodiment of the present invention.

At an initializing step 101 of the filter W, an initial value of the coefficient (W) of the ADF(W) 56 for producing the speaker control signal S8 is set. At a calculation step 102 of the virtual input signal, in the circuit of FIG. 3, the noises from the noise source i are detected by the reference sensor 2, the reference signal S2b outputted from the A/D converter 52b is entered into a transfer function predicting unit ADF (C) 59, and this reference signal S2b is convolution calculated with the previously supplied predicted value C of the transfer function, thereby producing the virtual input signal S9. At a step 103 for inputting the virtual input signal S9 and the noise-reduction error sensor output signal S4, an interference sound between the noises propagated from the noise source 1 and the adding sound generated from the speaker 3 is detected by the error microphone 4, and both the detection signal S4 outputted from the A/D converter 55 and the virtual input signal S9 are entered into the filter coefficient controlling unit 58. At a step 104 for updating the filter W, in the filter coefficient control unit 58, the coefficient (W) of the ADF(W) 56 is updated in accordance with the adaptive algorithm, using the detection signal S4 and the virtual input signal S9 in order to minimize the squared value of the detection signal S4. At an environmental change detecting step 105, a norm $\|\{S4(t1)\}^2-\{S4(t2)\}^2\|$ of the difference between the squared values of the detection signals S4(t1) and S4(t2), detected at the different times t1 and t2 during the noise reduction operation, is calculated. When the calculation result is smaller than the judging reference value $\rho 1$, it is judged that no environmental change is produced, and the process operation is returned to step 102 for calculating the virtual input signal S9 so as to continue this process operation. To the contrary, when the calculation result is greater than the judging reference value $\rho 1$, it is so judged that the transfer function is required to be changed due to the environmental change, and then a step 106 for determining the transfer function C (will be described next) is performed. At the step 106 for determining this transfer function C, the above-described predicted value of the transfer function is changed into an actually proper predicted value of the transfer function, and then the process operation is repeated from the initializing step 101 for the filter W. It should be noted that the predicted value of the transfer function may be changed by selecting a proper value from the previously prepared values.

Figure 5A:
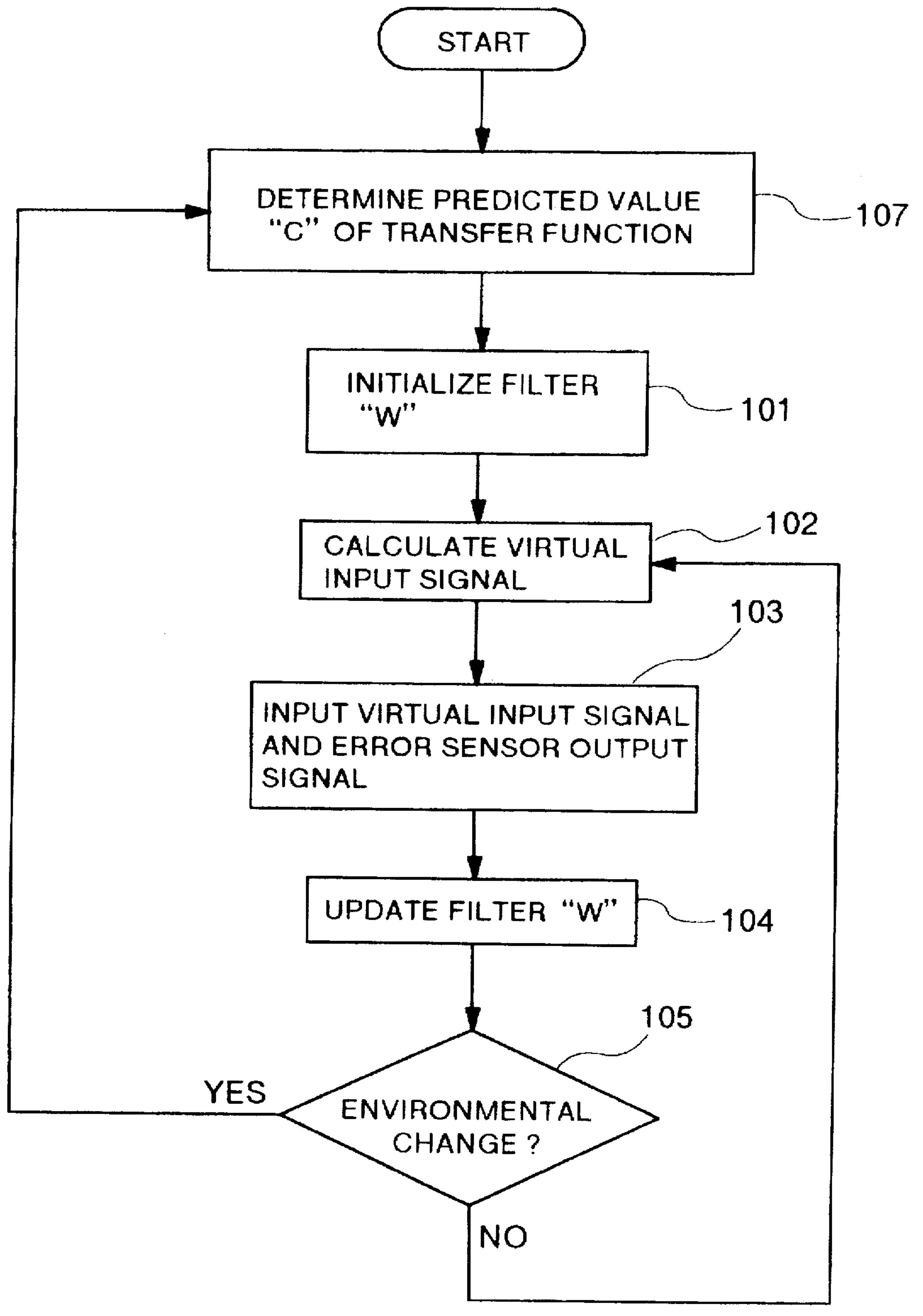
FIG. 5A is a flow chart for showing another embodiment in which the predicted value of the transfer function is updated.
Figure 5B:
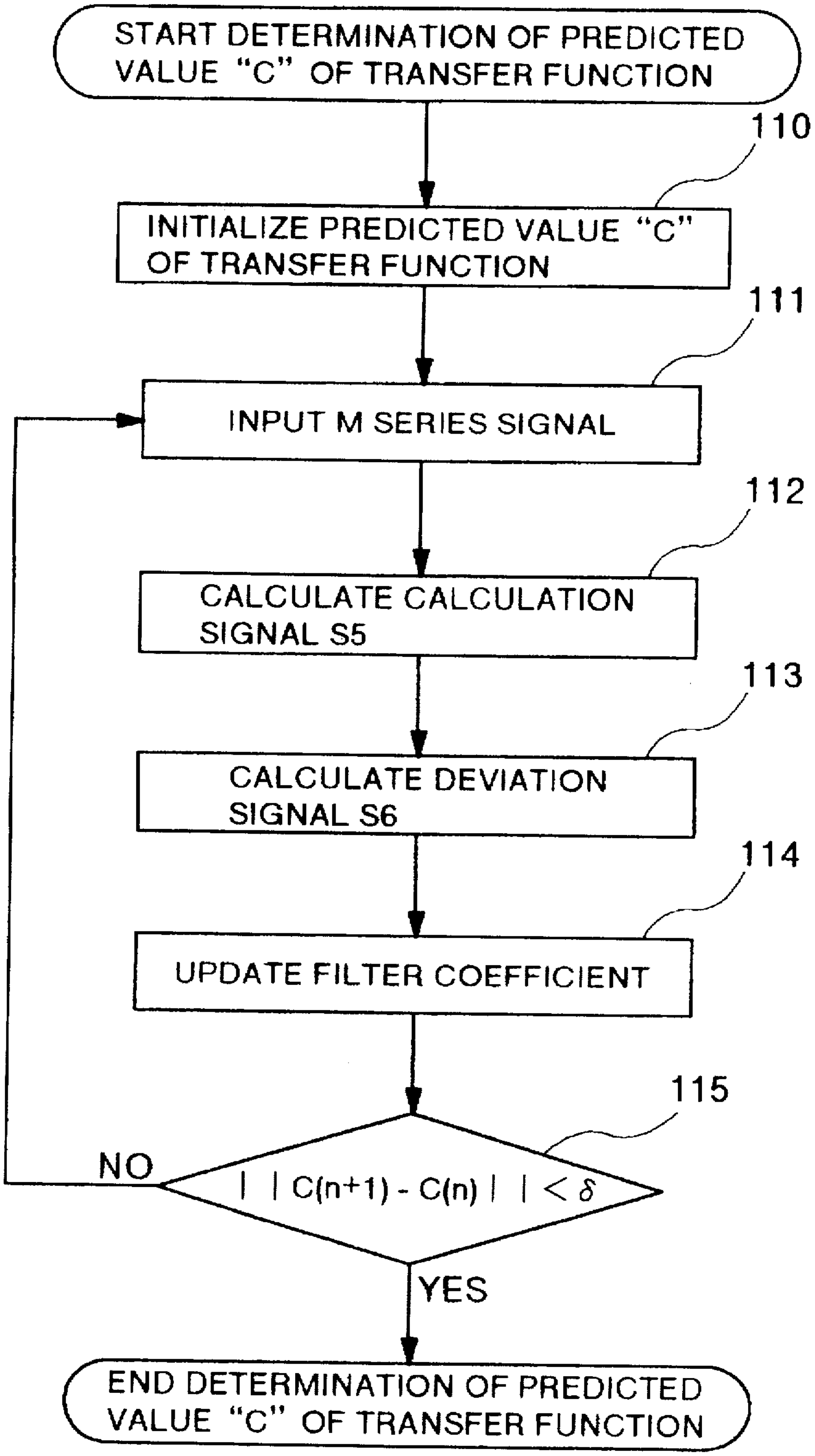
FIG. 5B is a flow chart for determining the predicted value of the transfer function.

FIG. 5A and FIG. 5B are flow charts for updating the predicted value of the transfer function in accordance with the environmental changes according to another embodiment of the present invention. At a first step, a calculation is carried out for the predicted value "C" of the transfer function in the connection circuit of FIG. 2 (step 107). A detailed process operation defined at the step 107 is shown in FIG. 5B.

At an initializing step 110 of the predicted value C of the transfer function, an initial value of the coefficient of the ADF(C) 59 is set so as to produce the calculation signal S5. At an input step 111 of the M series signal S2, a signal S1 outputted from the noise signal generating source 51 is A/D-converted into a reference signal S2*a* by an A/D converter 52*a*, and this reference signal S2*a* is entered into the ADF(C) 59. At a step 112 for calculating the calculation signal S5, the reference signal S2*a* is convolution-calculated by the ADF(C) 59 to produce the calculation signal S5. At a step 113 for calculating a deviation signal S6, the reference signal S2*a* is supplied via the D/A-converter 53 and the power amplifier 54 to the speaker 3 so as to produce sound. This sound is detected by the error microphone 4, and both the detection signal 84 outputted from the A/D converter 55 and the calculation signal S5 are entered into the subtracter 57, so that this calculation signal S5 is subtracted from the detection signal S4 to produce a deviation signal S6. At a step 114 for updating the filter coefficient, the coefficient of the ADF(C) 59 is updated in the filter coefficient control unit 58 in accordance with the adaptive algorithm with employment of the reference signal S2*a* and the deviation signal S6 in order to minimize the squared value of the deviation signal S6. At a step 115 for judging convergence by the coefficient change norm, a calculation is made of a difference $\|\{C(n+1)-C(n)\}\|$ between the updated coefficient C(n+1) and the coefficient before updating C(n) of the ADF(C) 59. When the calculation result is greater than the judging reference value "δ", the process operation is returned to the input step 111 for the M series signal S2*a* so as to continue the process operation. On the other hand, when the calculation result is smaller than the judging reference value "δ", the process for determining the predicted value C of the transfer function is accomplished.

Subsequently, the noise reduction control is carried out based on process steps 101 to 105 similar to those of FIG. 4 by way of the circuit connection of FIG. 3. When an environmental change happens to occur under which the value of the transfer function must be changed, a calculation is newly performed to obtain a predicted value of the transfer function in accordance with process steps 110 to 115 by way of the circuit connection shown in FIG. 2.

As another embodiment of the above-described environmental change detecting process 105 defined in FIG. 4 and FIG. 5A, a calculation is performed for a norm of the difference between absolute values of the detection signals S4(t1) and S4(t2) which have been detected at different times t1 and t2 during the noise reduction operation, and then this calculation result may be compared with the judging reference value "ρ2"

In other words, if $$\|\,|S4(t1)|-|S4(t2)|\,\| \geqq \rho 2,$$

then it is so judged that the environment change happens to occur, and thereafter the predicted value of the transfer function is changed at the step 106 or 107. If $$\|\,|S4(t1)|-|S4(t2)|\,\| < \rho 2,$$

then the process operation is advanced to the step 102.

Furthermore, as another embodiment of the step 105, a calculation is performed for a norm of a difference between the coefficient values W(t1) and W(t2) of the ADF(W) 59, which have been obtained at the different times t1 and t2 during the noise reduction operation, and then this calculation result may be compared with the judging reference value "ρ3".

That is, if $$\|W(t1)-W(t2)\| \geqq \rho 3,$$

then it is so judged that the environmental change happens to occur, and thereafter the predicted value of the transfer function is changed at the step 106 or 107. To the contrary, if $$\|W(t1)-W(t2)\| < \rho 3,$$

then the process operation is advanced to the step 102.

Furthermore, as a further embodiment about the step 105, the squared value of the detection signal S4 may be compared with the judging reference value "ρ4". Namely, if $$S4^2 \geqq \rho 4,$$

then it is so judged that the environmental change happens to occur, and thereafter the predicted value of the transfer function is changed at the step 106 or the step 107.

Conversely, if $S4^2 < \rho 4$, then the process operation is advanced to the step 102.

Moreover, as another embodiment of the step 105, a temperature sensor is employed, and thus a check may be performed as to whether or not the detection signal derived from the temperature sensor is within a preselected range. If this detection signal is outside the preselected range, then the process detection is advanced to the step 106 or the step 107. Conversely, if this detection is within the predetermined range, then the process operation is advanced to the step 102. The method for changing the predicted value C of the transfer function may be realized by selectively employing a plurality of predicted values which have been previously prepared in accordance with the monitoring results.

Figure 6:
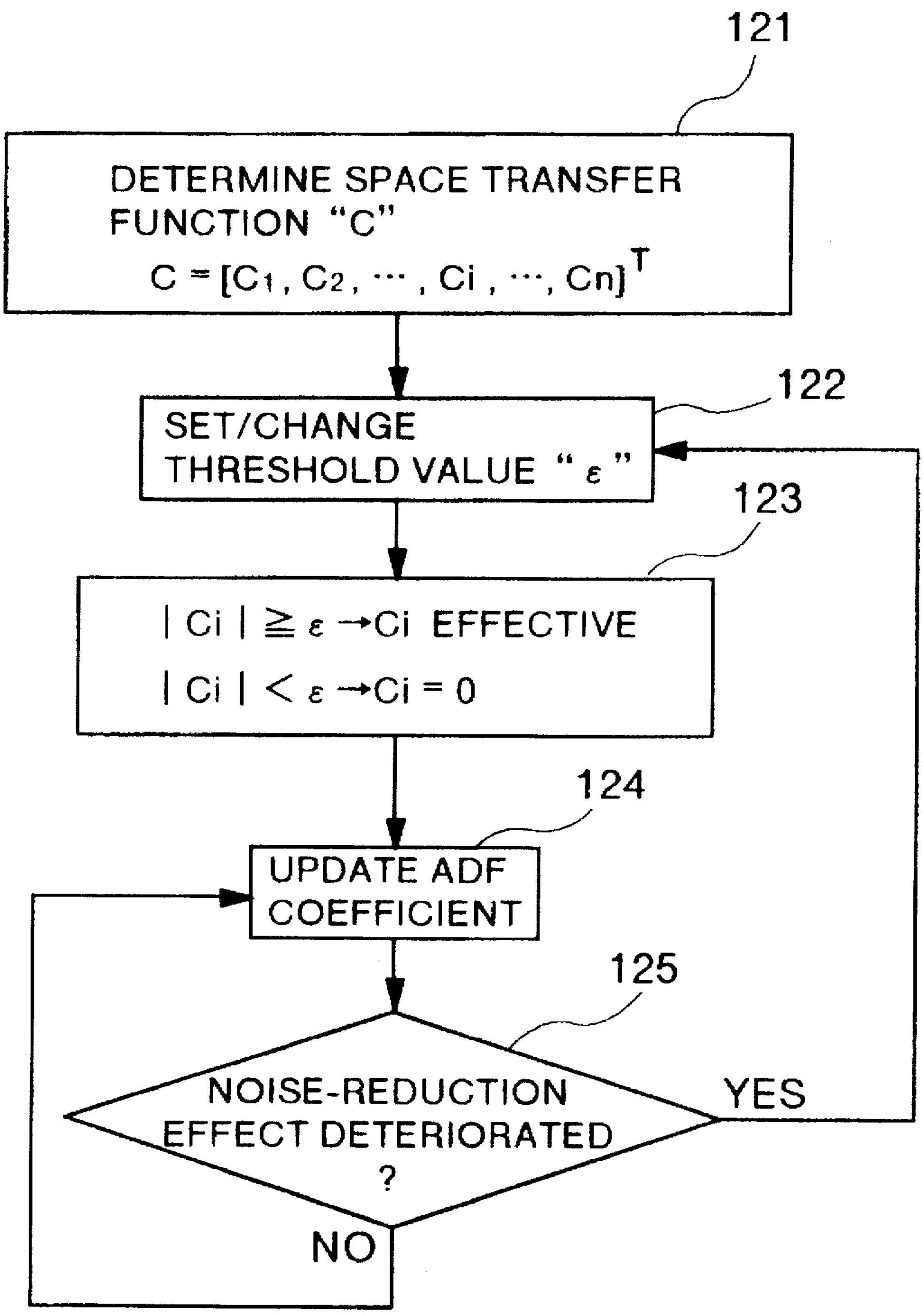
FIG. 6 is a flow chart for determining the predicted value of the transfer function.

FIG. 6 is a flow chart for representing another embodiment of the present invention, in which the predicted value of the transfer function is updated.

This embodiment is a control method for changing the tap number of the ADF(C) 59 for setting the predicted value C of the transfer function used in the noise reduction control process in FIG. 3.

Figure 7:
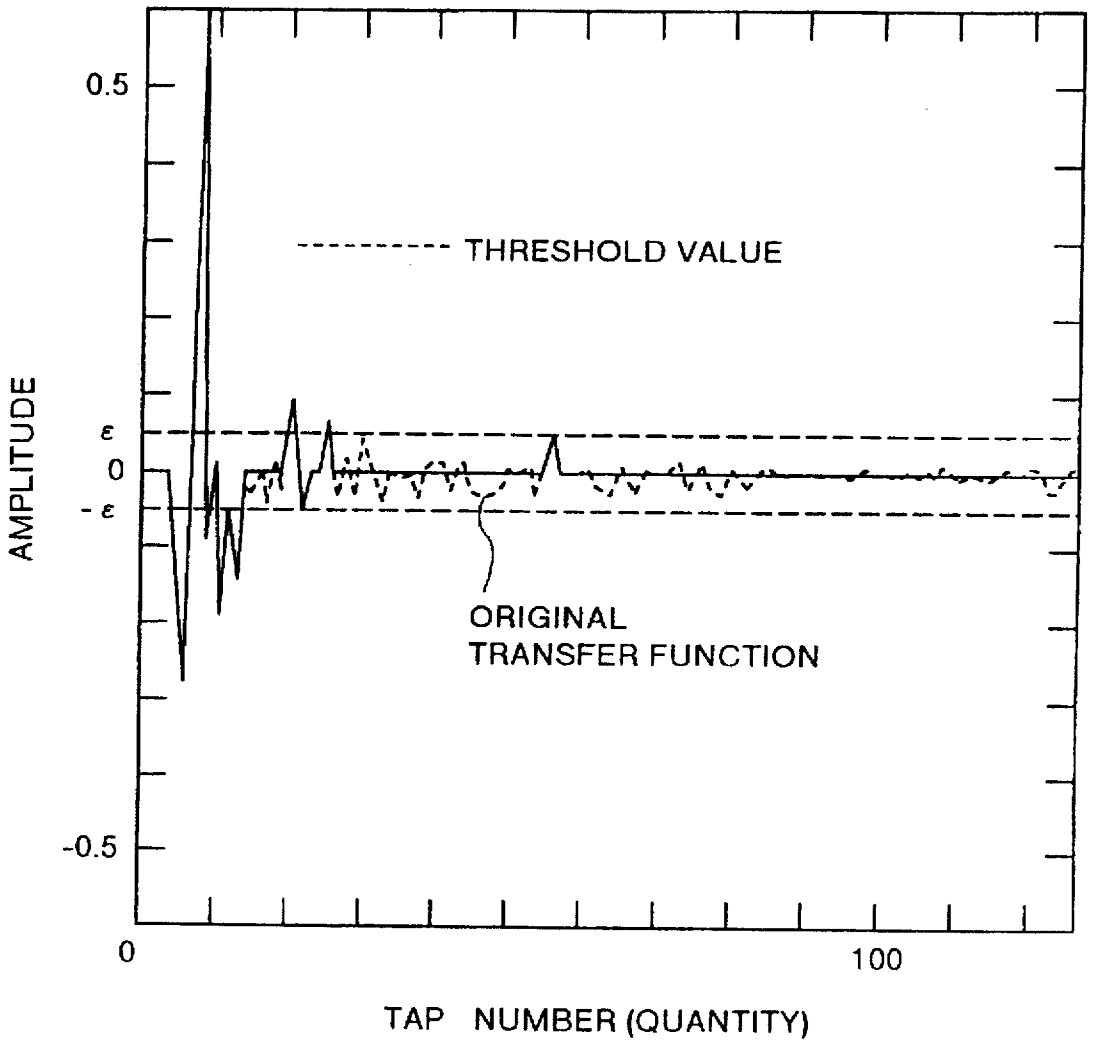
FIG. 7 graphically shows the relationship between the transfer function and the threshold value.

This embodiment is arranged in a similar manner to that of FIG. 1, and in step 121 the predicted value C of the transfer function is calculated by the above-described manner, as illustrated in FIG. 7. Thereafter, the controller 5 compares the predicted value C of the transfer function used in the calculation with a preset threshold value "ε" (step 122), and treats a value smaller than the threshold value as a "0", which is limited to the tap number (quantity) greater than this threshold value (step 123). The coefficient updating control by the ADF(W) 56 is executed in accordance with the signal process using the predicted value of this selected tape number in order to minimize the squared value of the detection signal S4 from the error microphone 4 (step 124).

Then, a check is done as to whether or not the noise reduction effect achieved by updating this coefficient due to the environmental change is lower than the judging reference value. If this noise reduction effect is lowered, then the threshold value "ε" is changed into a small value, and then the tap number of the ADF(C) 59 is increased which is used in the control process calculation.

Figure 8:
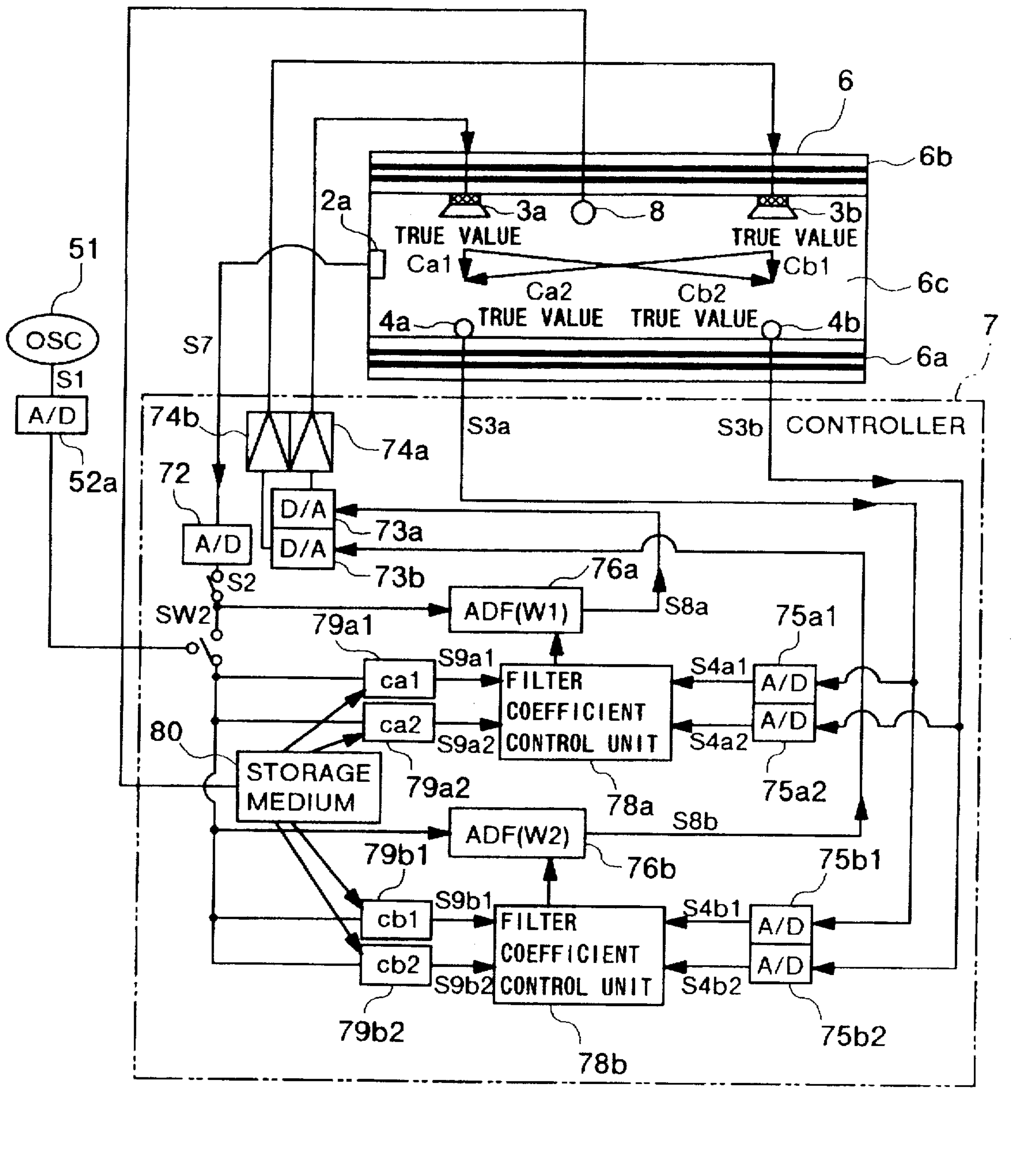
FIG. 8 is a schematic block diagram showing an active noise-reduction controlling apparatus according to another embodiment of the present invention.

FIG. 8 schematically shows an arrangement of an active noise-reduction controlling apparatus according to another embodiment of the present invention.

The active noise-reduction controlling apparatus of FIG. 8 is equipped with a current signal detecting apparatus 2*a* for detecting a load current of a drive motor corresponding to a noise source employed in an air conditioning apparatus, functioning as a noise source information sensor; speakers 3a and 3b provided within a air blowing duct 6, for producing an adding acoustic wave to reduce the noises; error microphones 4a and 4b; a controller 7; and a temperature sensor 8 and the like. Air is sucked from a lower portion 6a and an upper portion 6b of the air blowing path 6, and blown out from a center portion 6c.

The controller 7 employed in this embodiment performs a control to continuously update the coefficients W1 and W2 of the adaptive digital filters 76a and 76b. That is, the reference signal obtained by the current signal detecting apparatus 2a is processed by the adaptive digital filters 76a and 76b, and then the filtered reference signals are supplied to the speakers 3a and 3b, and the above-described coefficient updating control is carried out by utilizing both a virtual input signal and the detection signals from the error microphones 4a and 4b in accordance with the adaptive algorithm in order to minimize the squared value of the detection signals (namely, sound pressure given to microphone). The virtual input signal is produced by executing a convolution-calculation between the reference signal and predicted values Ca1 and Ca2, and Cb1 and Cb2 of the transfer function between the speakers 3a, 3b and the error microphones 4a, 4b.

To obtain the predicted values Ca1, Ca2 and the predicted values Cb1, Cb2 of the transfer function required to carry out this adaptive control, the controller 7 calculates the predicted values Ca1, Ca2, Cb1, Cb2 of the transfer function between the speakers 3a, 3b and the error microphones 4a, 4b by entering the reference signal S1 in the digital form such as the M series signal from a certain noise signal generating source 51 as shown in FIG. 2. These predicted values Ca1, Ca2, Cb1, Cb2 are calculated under plural environmental conditions while changing the environmental temperature, thereby obtaining a plurality of predicted values $(Ca1, Ca2, Cb1, Cb2)_1$ to $(Ca1, Ca2, Cb1, Cb2)_n$, which, will then be stored in a storage medium 80. For instance, the predicted values $(Ca1, Ca2, Cb1, Cb2)_1$ are such values calculated at a first environmental temperature, the predicted values $(Ca1, Ca2, Cb1, Cb2)_2$ are such values calculated at a second environmental temperature, and the predicted values $(Ca1, Ca2, Cb1, Cb2)_n$ calculated at an n-th environmental temperature.

Then, to perform the noise reduction control, the detection signal S7 outputted from the current detecting apparatus 2a as the noise information of the noise source is A/D-converted by the A/D converter 72 into a reference signal S2. This reference signal S2 is convolution-calculated using the coefficients of the adaptive digital filters 76a and 76b, thereby producing speaker control signals S8a and S8b used to produce such adding acoustic waves that the detection signals from the error microphones 4a and 4b can be minimized. These speaker control signals S8a and S8b are converted into analog speaker control signals by the D/A converters 73a and 73b and are then amplified by the power amplifiers 74a and 74b to be supplied to the speakers 3a and 3b. The detection signals S3a and S3b which are detected by the error microphones 4a and 4b, and respond to the sound pressure of the acoustic waves derived from the noise source and the speaker 3a and 3b, are A/D-converted by the A/D converters 75a1, 75a2 and the A/D converters 75b1, 75b2 to obtain the detection signals S4a1, S4a2, S4b1, S4b2 respectively. These detection signals S4a1, S4a2, S4b, S4b2 are inputted into filter coefficient control units 78a and 78b. The reference signals S2 is passed through transfer function functioning units 79a1, 79a2, 79b1, 79b2, so that virtual input signals S9a1, S9a2, S9b1, S9b2 which have been convolute-calculated with the predicted values Ca1, Ca2, Cb1, Cb2 of the transfer function are generated. With employment of these virtual input signals S9a1, S9a2, S9b1, S9b2 and the detection signals S4a1 to S4b2, the filter coefficient control units 78a, 78b are operated to continuously update the coefficients W1 and W2 of the adaptive digital filters 76a, 76b in order to minimize the squared values of these detection signals S4a1 to S4b2 in accordance with the adaptive algorithm.

In a case in which an environmental change happens to occur during the noise-reduction operation with respect to a plurality of error microphones 4a and 4b installed at positions where noises are to be lowered, if the squared value of the detection signal S3a of the error microphone 4a exceeds a certain judging reference, then the predicted value of the transfer function between the input signal to the speaker and the output signals from the error microphones is first updated. Subsequently, if the squared value of the detection signal S3b of the error microphone 4b exceeds a certain judging reference, then the predicted value of the transfer function is again updated. As described above, the predicted values of the transfer function may be sequentially changed while the information about the respective detection signals of the error microphones is used as the independent judging basis.

The present invention may be applied to all of such objects that the acoustic transfer characteristics between the speaker inputs and the error microphone outputs are varied during the noise reduction operation in such a system that the acoustic waves for constituting noises are propagated into space whose noises should be reduced. For instance, noises produced from indoor air conditioning apparatuses and automobile's room.

Furthermore, the above-described filter coefficient control units 78a and 78b selectively use the predicted values Ca1, Ca2, Cb1, Cb2 of the transfer function which have been previously predicted and preset in order that the noise reduction effect is not lowered due to a change in the transfer function in connection with a temperature variation during the noise reduction operation. When the temperature of the acoustic wave propagating space happens to be changed during the noise-reduction operation, the true value of the transfer function is changed, so that the predicted value which is used in the noise-reduction controlling calculation is deviated from the actual condition or actual value. The filter coefficient control units 78a and 78b monitor the environmental temperature with reference to the detection signal of the temperature sensor 8 during the noise-reduction controlling operation in which the predicted values (Ca1, Ca2, Cb1, Cb2)1 of the transfer function previously predicted under the first temperature condition are selectively read out from the storage medium 80 to be utilized, and when the temperature is brought to the second temperature condition, the predicted values (Ca1, Ca2, Cb1, Cb2)2 of the transfer function are read out from the storage medium 80 and used in the noise-reduction control by this filter coefficient control units 78a, 78b. Furthermore, when the temperature is brought to the n-th temperature, the filter coefficient control units read out the predicted values (Ca1, Ca2, Cb1, Cb2)n of the transfer function used in the control calculation from the storage medium 80 and use these predicted values.

It should be noted that although this embodiment corresponds to a case in which the two speakers 3a, 3b and the error microphones 4a, 4b are utilized, the total number, as well as the combination of these speakers and error microphone, may be arbitrarily varied.

As a method for updating the predicted value of the transfer function according to another embodiment, the following updating method may be realized.

Figure 9:
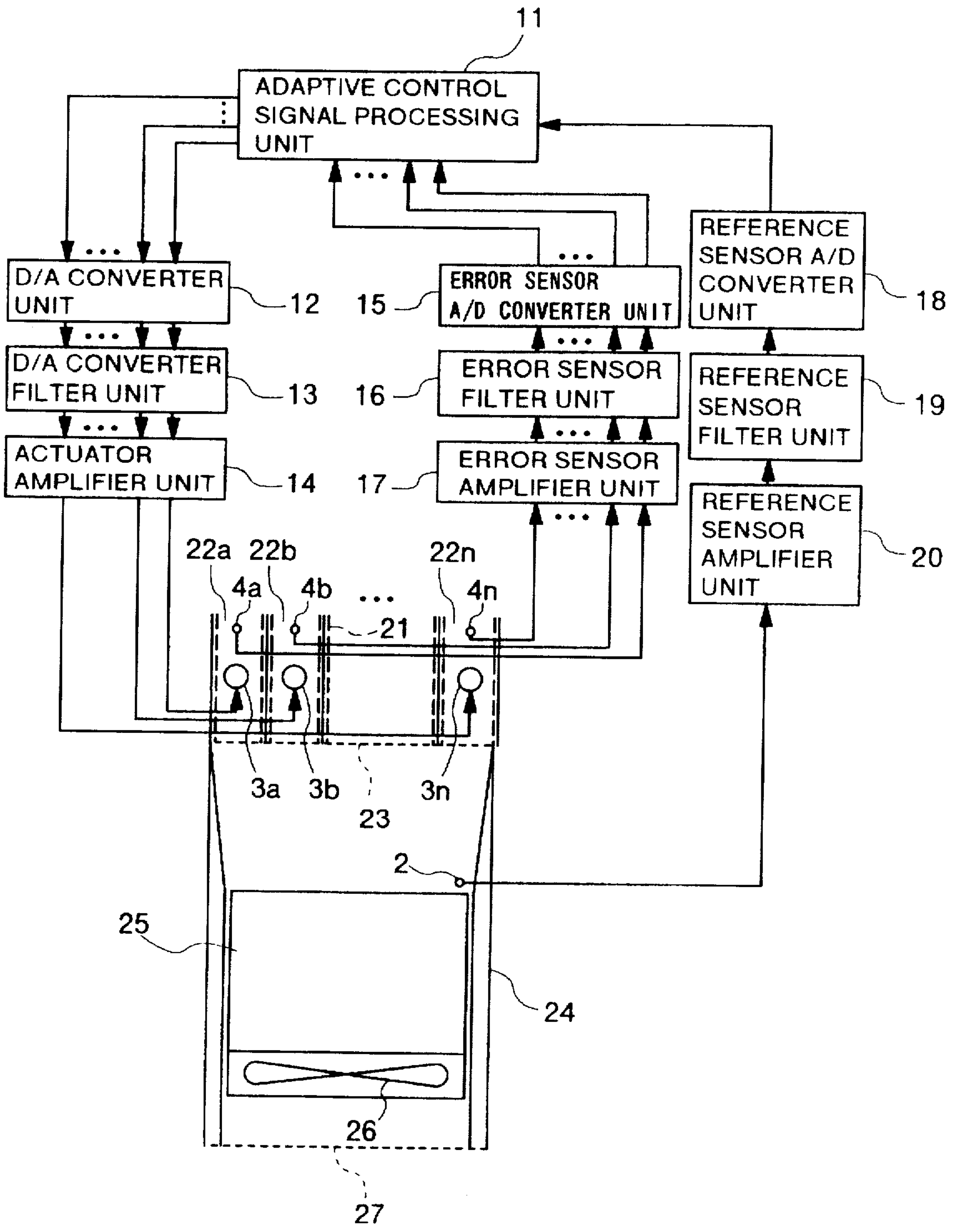
FIG. 9 is a schematic block diagram indicating an active noise-reduction controlling apparatus with employment of a plurality of acoustic wave propagation paths.

FIG. 9 schematically represents a general-purpose computer capable of reducing air propagation noise by employing the active noise-reduction controlling apparatus according to the present invention. In this embodiment, a ventilation unit is segmented into parallel ventilation paths, and then the active noise reduction is performed in each of these parallel ventilation paths.

In FIG. 9, reference numeral 11 indicates an adaptive control signal processing unit, reference numeral 12 denotes a D/A converter unit, reference numeral 13 shows a filter unit for the D/A converter, reference numeral 14 is an amplifier unit for a speaker, and reference numeral 15 shows an A/D converter for a noise-reduction error sensor. Reference numeral 16 denotes a filter unit for the noise-reduction error sensor reference numeral 17 indicates an amplifier unit for the noise-reduction error sensor, reference numeral 18 represents an A/D converter unit for a reference sensor, reference numeral 19 shows a filter unit for the reference sensor, and reference numeral 20 indicates an amplifier unit for the reference sensor. Also, reference numerals 22*a* to 22*n* are a plurality of acoustic wave propagation paths arranged in such a manner that the ventilation path of the exhausting unit is segmented into a plurality of ventilation paths arranged in a parallel form, reference numerals 4*a* to 4*n* indicate noise reduction error sensors such as microphones provided on the exit sides of the above-described acoustic wave propagation paths 22*a* to 22*n*. Further, reference numerals 3*a* to 3*n* show speakers provided on the entrance sides of the acoustic wave propagation paths 22*a* to 22*n*, reference numeral 2 is a reference sensor such as a microphone for sensing noise information, reference numeral 24 indicates a case or a housing. Moreover, reference numeral 26 shows a cooling fan, reference numeral 25 shows an object to be cooled, reference numeral 27 denotes an air intake unit, reference numeral 23 shows an air exhaust unit, and reference numeral 21 denotes a sound (noise) absorbing material.

A first description will now be made of an occurrence of noise. When the cooling fan 26 is rotated, air at the ordinary temperature or a low temperature is externally sucked from an air intake unit 27 and is pressured by this cooling fan 26 at a pressure higher than the atmospheric pressure, and then the pressurized air is blown toward the object containing a heating member 25 to be cooled (positions of cooling fan 26 and object 25 to be cooled may be reversed from those shown in FIG. 9). A heat exchange is carried out between the air at the ordinary temperature or the low temperature and the heating member of the object 25 to be cooled, and then the air whose thermal energy becomes large is externally exhausted from the exhausting unit 23. At this time, vibrating noise and aerodynamic noise of the cooling fan 26, as well as secondary noise at the object 25 to be cooled are produced within the case 24. This acoustic wave will be leaked out from the air intake unit 27 and the air exhaust unit 23, causing noises.

Next, the active noise reduction or cancellation will be explained. In accordance with the active noise-reduction control, noise information highly relative to the noise is detected by the reference sensor 2 to produce the reference signal. Then, this reference signal is amplified by the reference sensor amplifier unit 20, and only the frequency components which should be reduced or canceled are derived from the reference sensor filter unit 19. Thus, the derived frequency components are A/D-converted by the reference sensor A/D converter 18 into digital data which is then inputted as noise data into the adaptive control signal processing unit 11.

Also, the acoustic waves whose noise components are not reduced and which are propagated to the exit ports of the respective sound (acoustic waves) propagation paths 22*a* to 22*n* are detected by the respective noise-reduction error sensors 4*a* to 4*n*, so that a noise-reduction error signal for each of the sound propagation paths 22*a* to 22*n* is produced. This noise-reduction error signal is supplied via the noise-reduction error sensor amplifier unit 17, the noise-reduction error sensor filter unit 16, and the noise-reduction error sensor A/D-converter unit 15 to the adaptive control signal processing unit 11 as noise-reduction error data with respect to each of the sound propagation paths 22*a* to 22*n*.

The adaptive control signal processing unit 11 produces an adding sound control signal for each of these sound propagation paths 22*a* to 22*n* in accordance with the adaptive control based on the inputted noise data and noise-reduction error data, and then controls the speakers 3*a* to 3*n* via the D/A converter unit 12, the D/A converter filter unit 13, and the actuator amplifier 14 in response to this adding sound control signal, so that the adding acoustic waves for reducing noises are supplied inside the respective sound propagation paths 22*a* to 22*n*, and therefore the acoustic waves present within the respective sound propagation paths can be actively reduced or canceled.

Figure 10:
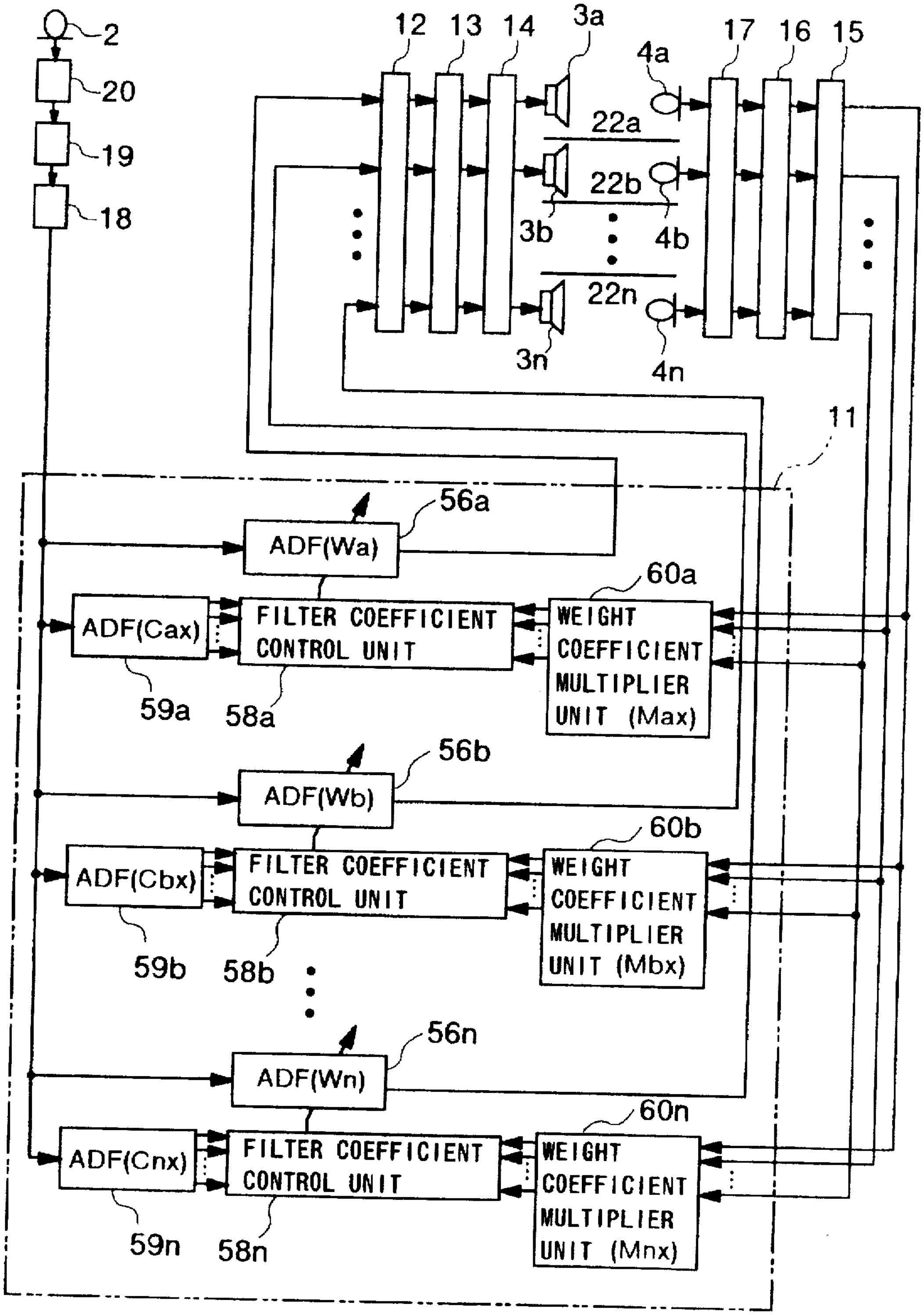
FIG. 10 is a schematic block diagram showing the active noise-reduction controlling circuit of FIG. 9.

Referring now to FIG. 10, the above-described adaptive control performed by the adaptive control signal processing unit 11 will be described. This drawing represents the signal processing function of the adaptive control signal processing unit 11 in a block diagram. In FIG. 10, reference numerals 56*a* to 56*n* indicate adaptive digital filters corresponding to the ADF(W1) 56 shown in FIG. 1, reference numerals 58*a* to 58*n* show filter coefficient control units corresponding to the filter coefficient control unit 58 of FIG. 1, reference numerals 59*a* to 59*n* indicate a transfer function prediction unit corresponding to the ADF(C) 59 of FIG. 1, and reference numerals 60*a* to 60*n* are weight coefficient multiplying units.

The noise data which is obtained by processing the noise source signal outputted from the reference sensor 2 is inputted into the adaptive digital filters 56*a* to 56*n*, and the respective transfer function prediction units 59*a* to 59*n*. Now, it should be understood that a transfer function Cax of the ADF(Cax) 59*a* corresponds to a predicted value of a space transfer function defined from the speaker 3*a* of the sound propagation path 22*a* to the respective noise-reduction error sensors 4*a* to 4*n*, a transfer function Cbx of the ADF(Cbx) 59*b* corresponds to a predicted value of a space transfer function defined from the speaker 3*b* of the sound propagating path 22*b* to the respective sound-reduction error sensors 4*a* to 4*n*, and another transfer function Cnx of the ADF(Cnx) 59*n* corresponds to a predicted value of a space transfer function defined from the speaker 3*n* of the sound propagation path 22*n* to the noise-reduction error sensors 4*a* to 4*n*. Also, the noise reduction error data which is obtained by processing the noise-reduction error signal outputted from the noise-reduction error sensors 4*a* to 4*n* is entered into the respective weight coefficient multiplier units 60*a* to 60*n*. Here, for example, the weight coefficient multiplier unit 60*a* weights each of the entered noise-reduction error data based on an arbitrary weight coefficient "Max". Similarly, other weight coefficient multiplier units 60*b* to 60*n* weight each of these noise-reduction error data with arbitrary weight coefficients Mbx to Mnx. The adaptive control for the speaker in the sound propagation path whose noise-reduction error level is high can be emphasized by performing such a weighting process.

Then, based on the data outputted from the respective transfer function prediction units 59a to 59n and the weight coefficient multiplier units 60a to 60n, adaptive control is carried out in the filter coefficient control units 58a to 58n with respect to the respective sound propagation paths 22a to 22n, and thus the coefficients (Wa to Wn) of the ADF 56a to 56n are arbitrarily changed. As a consequence, the noise-reduction adding acoustic waves produced from the speakers 3a to 3n can be optimized, thereby improving the noise-reduction effects. The predicted values Cax to Cnx of the transfer function may be corrected in response to environmental changes in accordance with the embodiment of FIG. 1.

Figure 11:
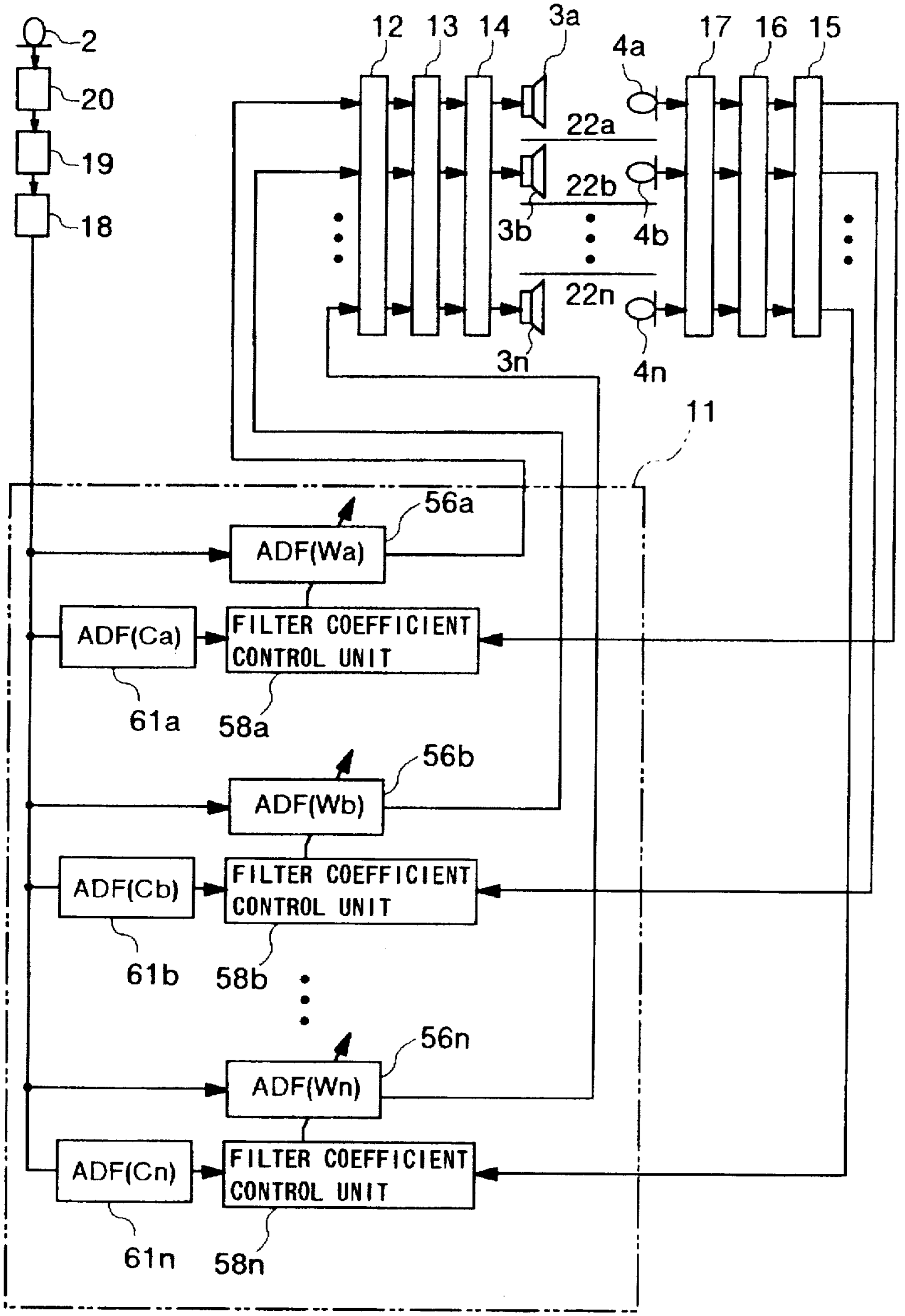
FIG. 11 is a schematic block diagram indicating the active noise-reduction controlling circuit according to another embodiment of the present invention.

FIG. 11 schematically represents the adaptive control performed by the adaptive control signal processing unit 11, according to another embodiment. The same reference numerals of the previous embodiment will be employed as those for denoting the same structural means in the following embodiment, and detailed explanations thereof are omitted. In FIG. 11, reference numerals 61a to 61n indicate transfer function prediction units ADF (Ca to Cn) exclusively used in the respective sound propagation paths 22a to 22n. In such a case that either the adding acoustic wave produced from, for instance, the speaker 3a located in the sound propagation path 22a is not propagated to the noise-reduction error sensors 4b to 4n of the sound propagation paths 22b to 22n, other than the relevant sound propagation path 22a, due to additional employment of sound absorbing materials, or the levels of the noise-reduction error signals obtained from the noise-reduction error sensors 4a to 4n of the sound propagation paths 22a to 22n are equal to each either, the higher active noise-reduction effects can be achieved with the independent adaptive controls with respect to the respective sound propagation paths 22a to 22n. Now, it should be understood that a transfer function Ca of the ADF(Ca) 61a corresponds to a predicted value of a space-transfer function defined from the speaker 3a of the sound propagation path 22a to the respective noise-reduction error sensor 4a, a transfer function Cb of the ADF(Cb) 61b corresponds to a predicted value of a space-transfer function defined from the speaker 3b of the sound propagating path 22b to the respective noise-reduction error sensors 4b, and another transfer function Cn of the ADF(Cn) 61n corresponds to a predicted value of a space-transfer function defined from the speaker 3n of the sound propagation path 22n to the noise-reduction error sensors 4a to 4n. Other processing functions are similar to those of the predetermined process unit.

Figure 12:
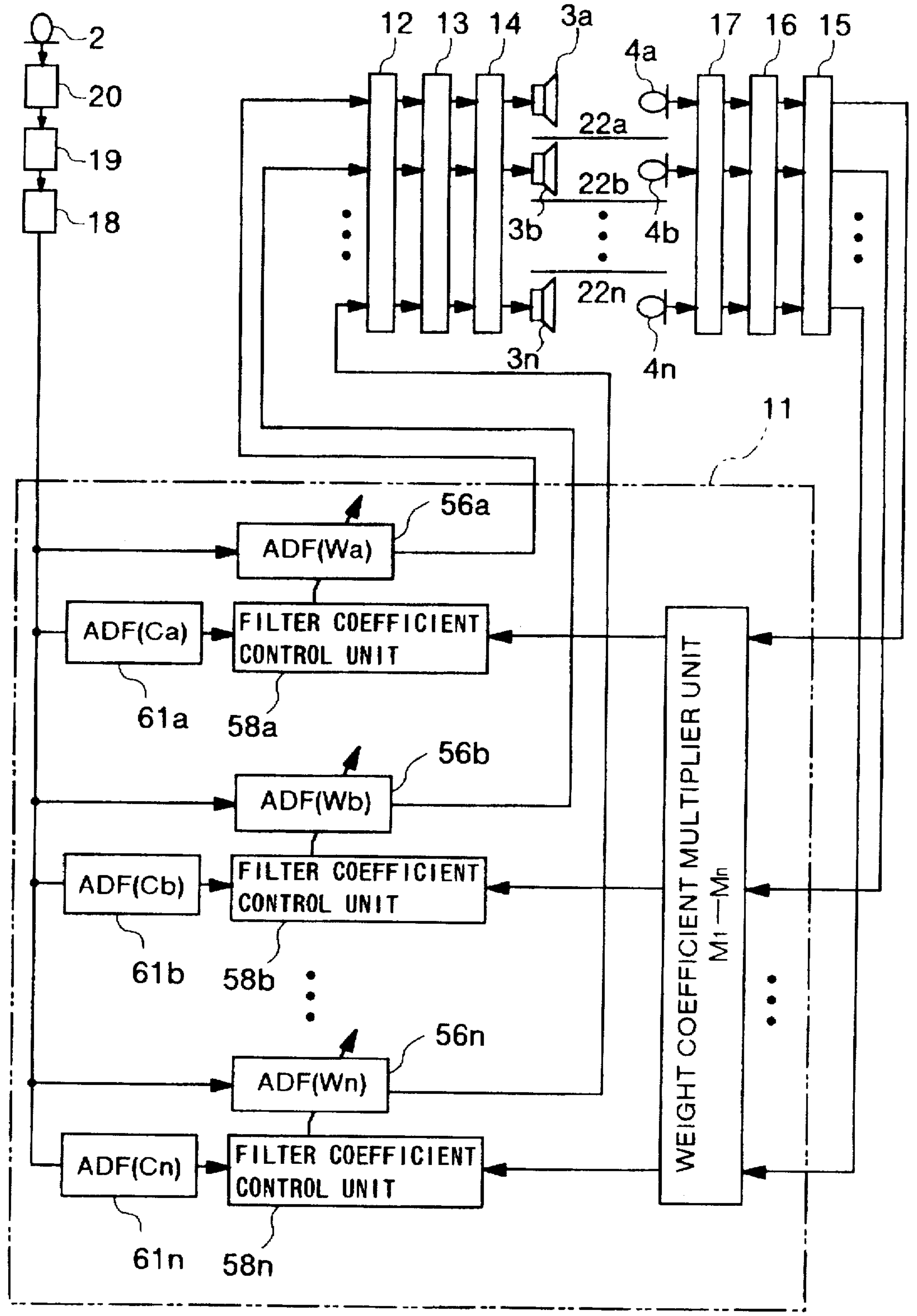
FIG. 12 schematically shows an embodiment in which a weight coefficient multiplying circuit is employed in the circuit of FIG. 11.

In this embodiment, the respective noise-reduction error data are not weighted and then are entered into the filter coefficient control units 58a to 58n. If necessary, as shown in FIG. 12, a weight coefficient multiplier unit 62 is additionally employed, so that the respective signals obtained from the noise-reduction error sensors are weighted by the optimum weight coefficients M1 to Mn, thereby effectively performing the active noise reduction.

Figure 13:
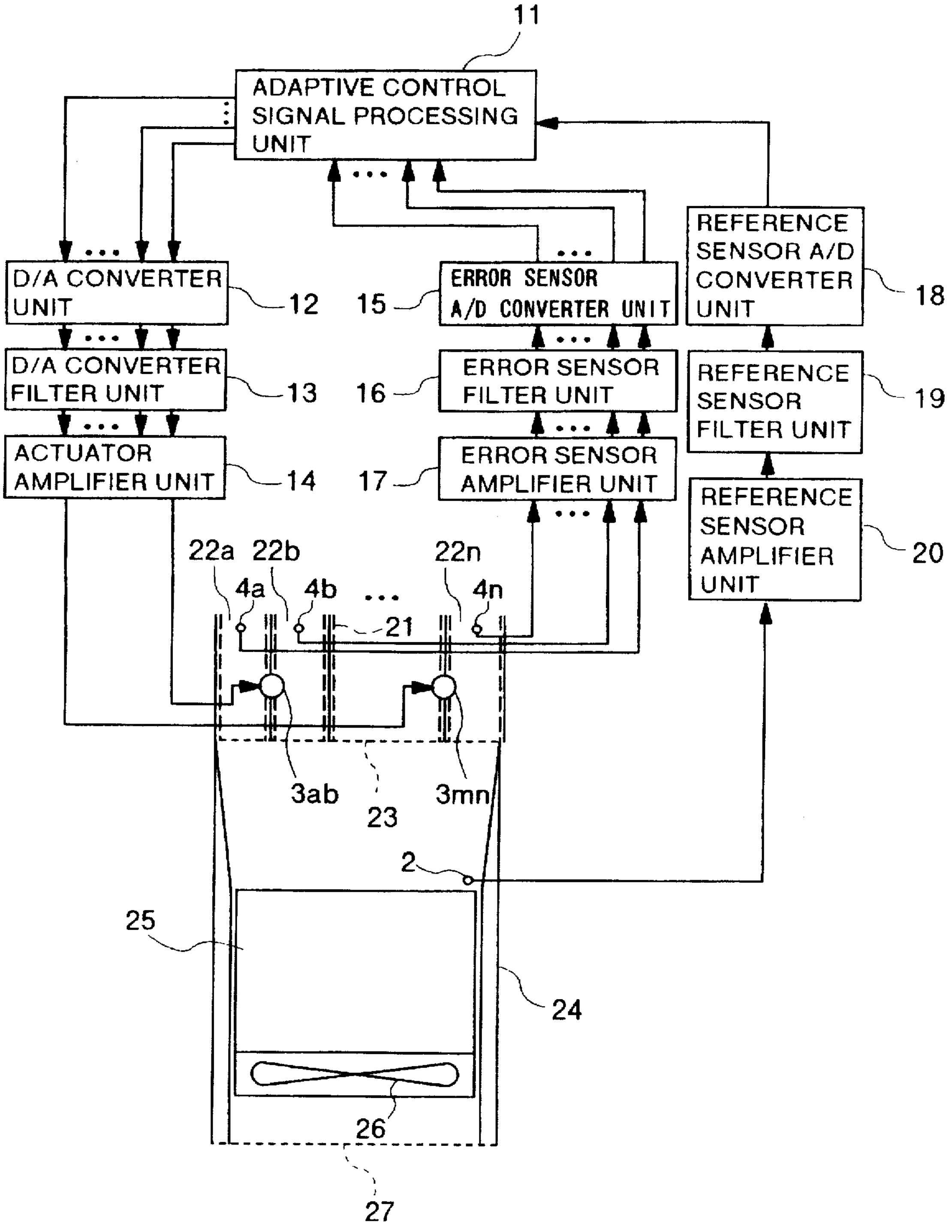
FIG. 13 schematically indicates an embodiment in which a speaker is commonly used with a plurality of acoustic wave propagation paths.
Figure 14:
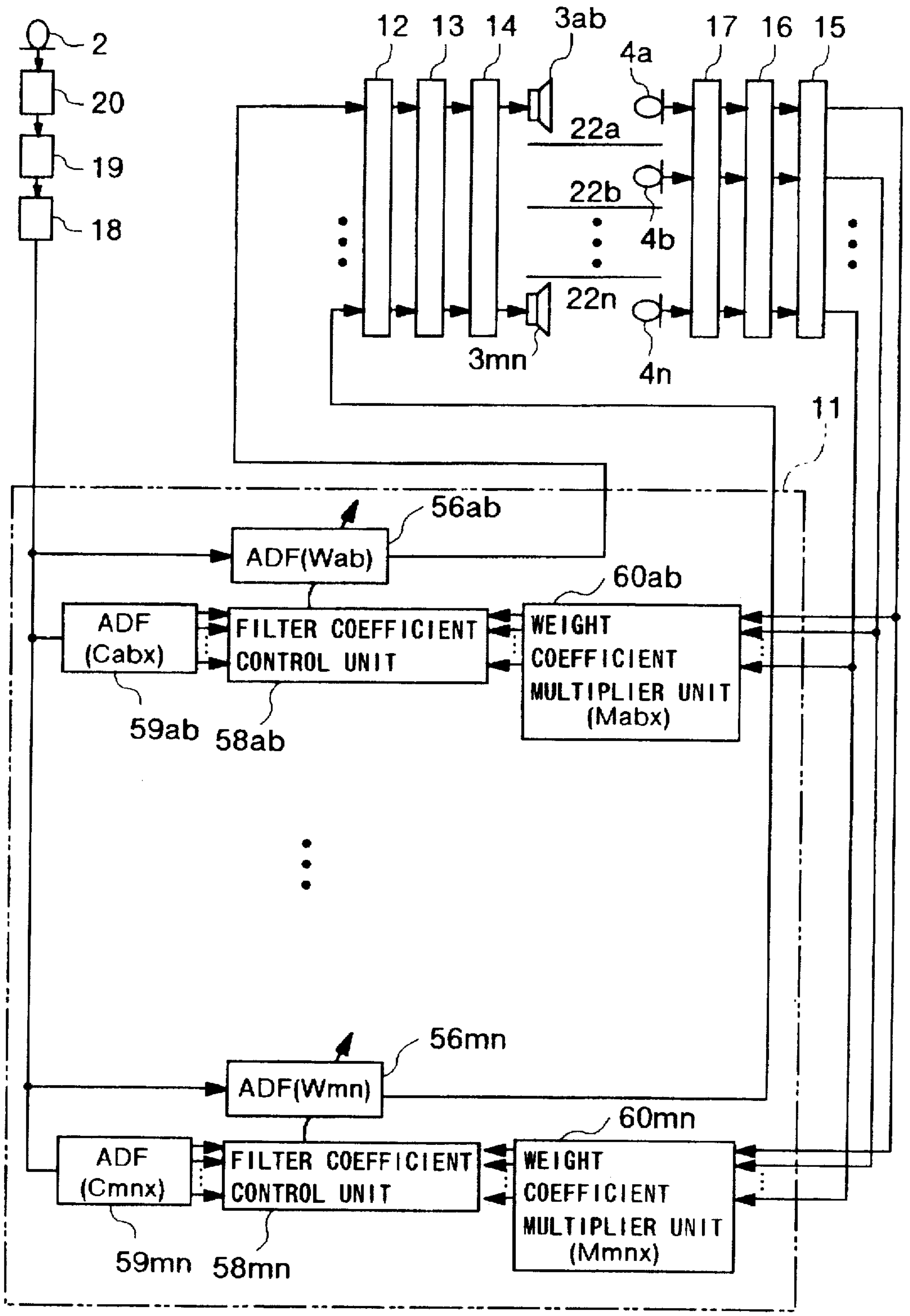
FIG. 14 is a schematic block diagram showing the active noise-reduction controlling circuit of FIG. 13.

In FIG. 13 and FIG. 14, there are represented such a general-purpose computer mounting an active noise-reduction controlling apparatus capable of applying a noise-canceling adding acoustic wave produced from a single speaker to two sets of adjoining sound (acoustic wave) propagation paths. It should be noted that the same reference numerals shown in the previous embodiment are employed as those for indicating the same or similar structural means.

In FIG. 13 and FIG. 14, reference numerals 3ab to 3 mm indicate speakers which are commonly provided for two sets of adjoining sound propagation paths on the entrance ports of the sound propagation paths 22a to 22n. When these sound propagation paths 22a to 22n are arranged in a matrix form, a single speaker may be commonly installed in the four adjoining sound propagation paths.

A description will now be made of such an active noise-reduction control that an adding acoustic wave produced from a single speaker is applied to a plurality of sound propagation paths.

Similar to the above-described embodiment, the noise information with a high relationship to the noises is detected by the reference sensor 2 to produce the reference signal, this reference signal is amplified by the reference sensor amplifier 20, and the frequency components to be noise-canceled are extracted by the reference sensor filter unit 19. The extracted frequency component is A/D-converted by the reference sensor A/D converter 18 into the digital frequency component signal which will then be entered as noise data into the adaptive control signal processing unit 11.

Then, the acoustic waves which could not be canceled from the respective sound propagation paths 22a to 22n are detected by the respective noise-reduction error sensors 4a to 4n to produce noise-reduction error signals for the respective sound propagation paths 22a to 22n. The noise-reduction error signal is supplied via the noise-reduction error sensor amplifier unit 17, the noise-reduction error sensor filter unit 16, and the noise-reduction error sensor A/D converter unit 15 to the adaptive control signal processing unit 11 as the noise-reduction error data for each of the sound propagation paths 22a to 22n.

In the adaptive control signal processing unit 11, the adding sound control signals are produced for each of two sets of adjoining sound propagation paths (22a, 22b) to (22m, 22n) in accordance with the adaptive control based on the inputted noise data and the noise reduction error data, the speakers 3ab to 3mn are driven via the D/A converter unit 12, the D/A converter filter unit 13, and the speaker amplifier 14 in response to the adding sound control signal, the noise-reduction adding acoustic waves are applied to the two sets of sound propagation paths (22a, 22b) to (22m, 22n), so that the acoustic waves appearing with the respective sound propagation paths 22a to 22n are actively noise-reduced.

The above-explained adaptive control signal processing unit 11 capable of executing such an active noise reduction by the adaptive control includes, as shown FIG. 14, adaptive digital filter units ADF (Wab to Wmn) 56ab to 56mn, filter coefficient control units 58ab to 58mn, transfer function prediction units ADF (Cabx to Cmn) 59ab to 59mn, and weight coefficient multiplier units 60ab to 60mn.

The noise data obtained by processing the reference signal outputted from the reference sensor 2 is inputted into the respective adaptive digital filter unit 56ab to 56mn, and the respective transfer function prediction units 59ab to 59mn. Now, it should be understood that a transfer function Cabx of the ADF (Cabx) 59ab corresponds to a predicted value of a space transfer function defined from the speaker 3ab to the respective noise-reduction error sensors 4a to 4n, a transfer function Cmnx of the ADF(Cmnx) 59mn corresponds to a predicted value of a space transfer function defined from the speaker 3mn to the respective sound-reduction error sensors 4a to 4n. Also, the noise reduction error data which are obtained by processing the noise-reduction error signals outputted from the noise-reduction error sensors 4a to 4n are entered into the respective weight coefficient multiplier units 60ab to 60mn. Here, for example, the weight coefficient multiplier unit 60ab weights each of the entered noise-reduction error data based on an arbitrary weight coefficient Mabx. Similarly, other weight coefficient multiplier units 60_mn_ weight each of these noise-reduction error data with arbitrary weight coefficients Mmnx.

Then, based on the data outputted from the respective transfer function prediction units 59_ab_ to 59_mn_ and the weight coefficient multiplier units 60_ab_ to 60_mn_, the adaptive control is carried out in the filter coefficient control units 58_ab_ to 58_mn_ with respect to the respective sound propagation paths 22_a_ to 22_n_, and thus the coefficients (Wab to Wmn) of the ADF 56_ab_ to 56_mn_ are arbitrarily changed. As a consequence, the noise-reduction adding acoustic waves produced from the speakers 3_ab_ to 3_mn_ can be optimized, thereby improving the noise-reduction effects.

For instance, when either the adding acoustic wave generated from the speaker 3_ab_ is not propagated, other than the noise-reduction error sensors 4_a_ and 4_b_, due to provision of the sound absorbing material 21, or the levels of the noise-reduction error signals obtained from the respective noise-reduction error sensors 4_a_ to 4_n_ are equal to each other, such an adaptive control may be achieved by utilizing the ADF (Cabx) defined from the speaker 3_ab_ to the noise-reduction error sensors 4_a_, 4_b_, and also the value obtained by arbitrarily weighting the respective noise-reduction error data produced from the noise-reduction error sensors 4_a_ and 4_b_ of the sound propagation paths 22_a_ and 22_b_ in the weight coefficient multiplier units 60_ab_ to 60_mn_.

As another embodiment, the noise-reduction error sensor 2 may be provided in each of the sound propagation paths. In another embodiment, when the speakers are commonly provided in a plurality of sound propagation paths, the noise-reduction error sensors may be provided in correspondence with these speakers. Further, the reference sensors may be employed in the respective sound propagation paths, or a single reference sensor may be employed in the plural sound propagation paths.

Figure 15:
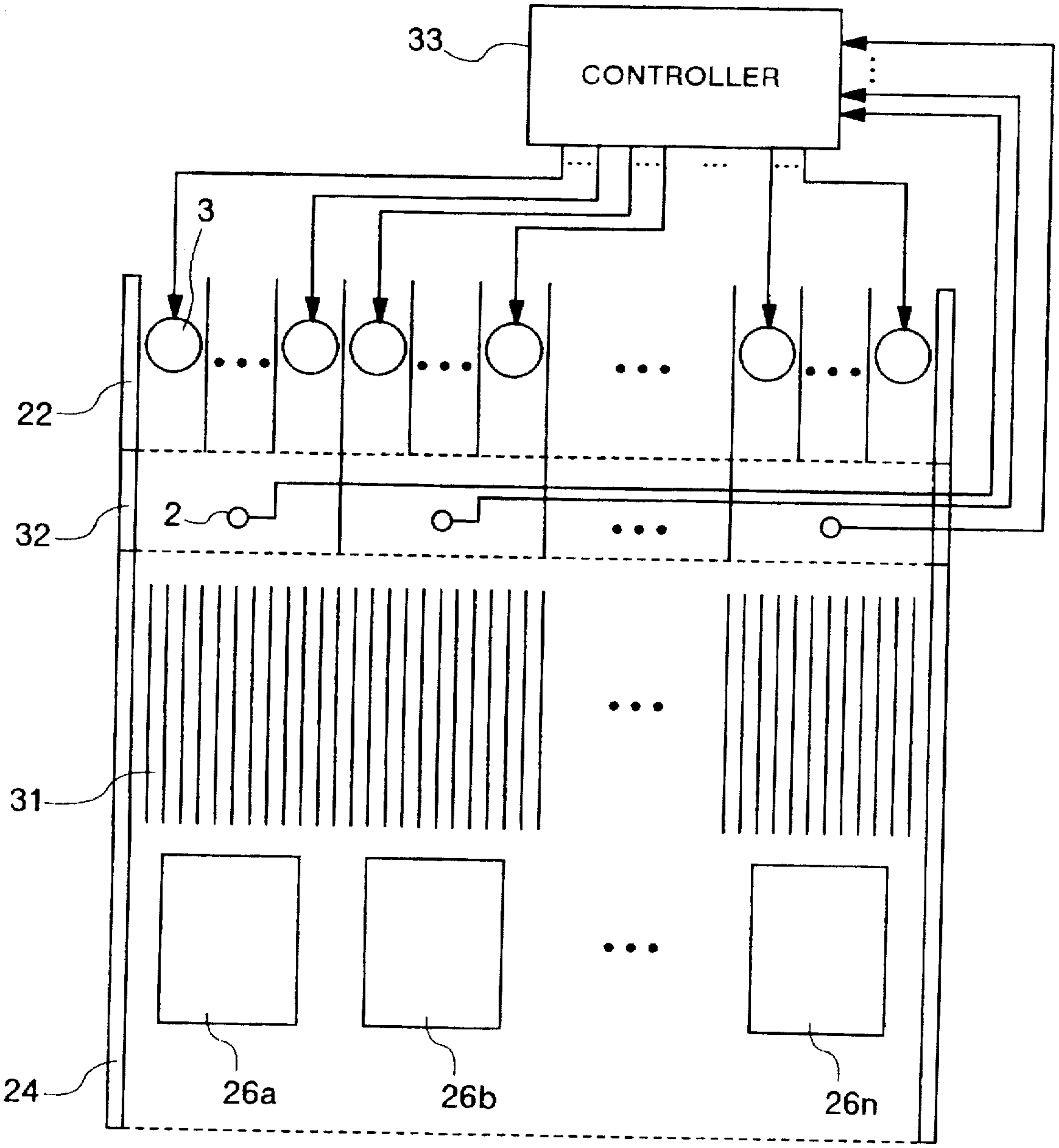
FIG. 15 schematically denotes an embodiment in which a mixing unit for acoustic waves is employed.

FIG. 15 schematically shows another embodiment of the present invention in which an active noise reduction is carried out without employing a noise-reduction error sensor. It should be noted that the same reference numerals shown in the noise-reduction controlling apparatuses of FIGS. 1, 9 and 10 will be employed as those for denoting the same or similar structural elements.

In FIG. 15, reference numeral 24 indicates a housing, reference numerals 26_a_ to 26_n_ show air blowers, reference numeral 31 represents a heating board group, reference numeral 3 is a speaker, reference numeral 2 shows a reference sensor, reference numeral 33 indicates a controller, reference numeral 32 denotes a mixing propagation path, and reference numeral 22 indicates a plurality of sound propagation paths.

An occurrence of noise will be first summarized. To cool the heating board group 31 stored within the housing 24, the air blowers 26_a_ to 26_n_ stored in this housing 24 are rotated to increase air, the air at the ordinary temperature or at the low temperature is sucked from outside the housing 24, and then the sucked air is blown out to the heating board group 31. It should be noted that the arrangement between the air blowers 26_a_ to 26_n_ and the heating board group 31 may be reversed with respect to that shown in FIG. 15. Then, heat exchange is carried out between the heating board group 31 and the air at the ordinary temperature, or at the low temperature, and thus the air whose heat energy becomes large is exhausted outside the housing 24. At this time, within this housing 24, the aerodynamic noises are produced from the heating board group 31 caused by the aerodynamic noises, and the electro-magnetic structure vibrating noises of the air blowers 26_a_ to 26_n_, and the secondary sound produced in the heating board group 31, namely the air stream blown out from the air blowers 26_a_ to 26_n_, and then the noises are leaked from the exhausting and intake portions outside the housing 24.

As shown in FIG. 15, in accordance with this embodiment, the mixing propagation path 32 is provided between a plurality of sound propagation paths 22 and the exhausting port of the air whose heat energy is increased (alternatively, the intake port of the air at the ordinary temperature or low temperature), and a plurality of sounds are mixed with each other within the mixing propagation path 32. This acoustic wave is actively noise-reduced within the propagation paths 22. Subsequently, the above-described active noise reduction will be described.

In accordance with the active noise-reduction control method, a plurality of acoustic waves propagated among the heating board group 31 are mixed with each other in the respective spaces defined in the mixing propagation path 32. The noise signal highly relative to the above-described noises is detected by the reference sensor 2 provided in correspondence with a plurality of sound sources. The noise-reducible signals used in the respective places of the plurality of sound propagation paths 22 are produced by the controller 33 together with the noise signal with high relativity, which become a signal for driving the speaker 3, and are converted into noise-reducing acoustic waves within the respective sound propagation path 22. As a consequence, destroyable interference may occur with respect to the above-described noises which are propagated through a plurality of sound propagation paths. Since the active noise reduction is carried out by employing a small number of reference sensors with the above-described operations, a total calculation amount may be reduced, so that since the calculation time required to process these signals can be shortened, it is possible to provide such a compact electronic apparatus, and further reduce the noises leaked from the housing 24.

As the noise-reduction signal formed by the controller 33, when analog control is carried out, such a noise-reduction signal is produced so that its amplitude is equivalent to that of the signal detected at the reference sensor 2, and its phase is reversed with respect to that of the signal detected at the reference sensor 2.

To the contrary, when digital control is carried out, the transfer function is previously measured, and also the signal detected by the reference sensor is subjected to convolution-calculation with this transfer function, whereby the noise-reduction signal is produced.

Figure 16:
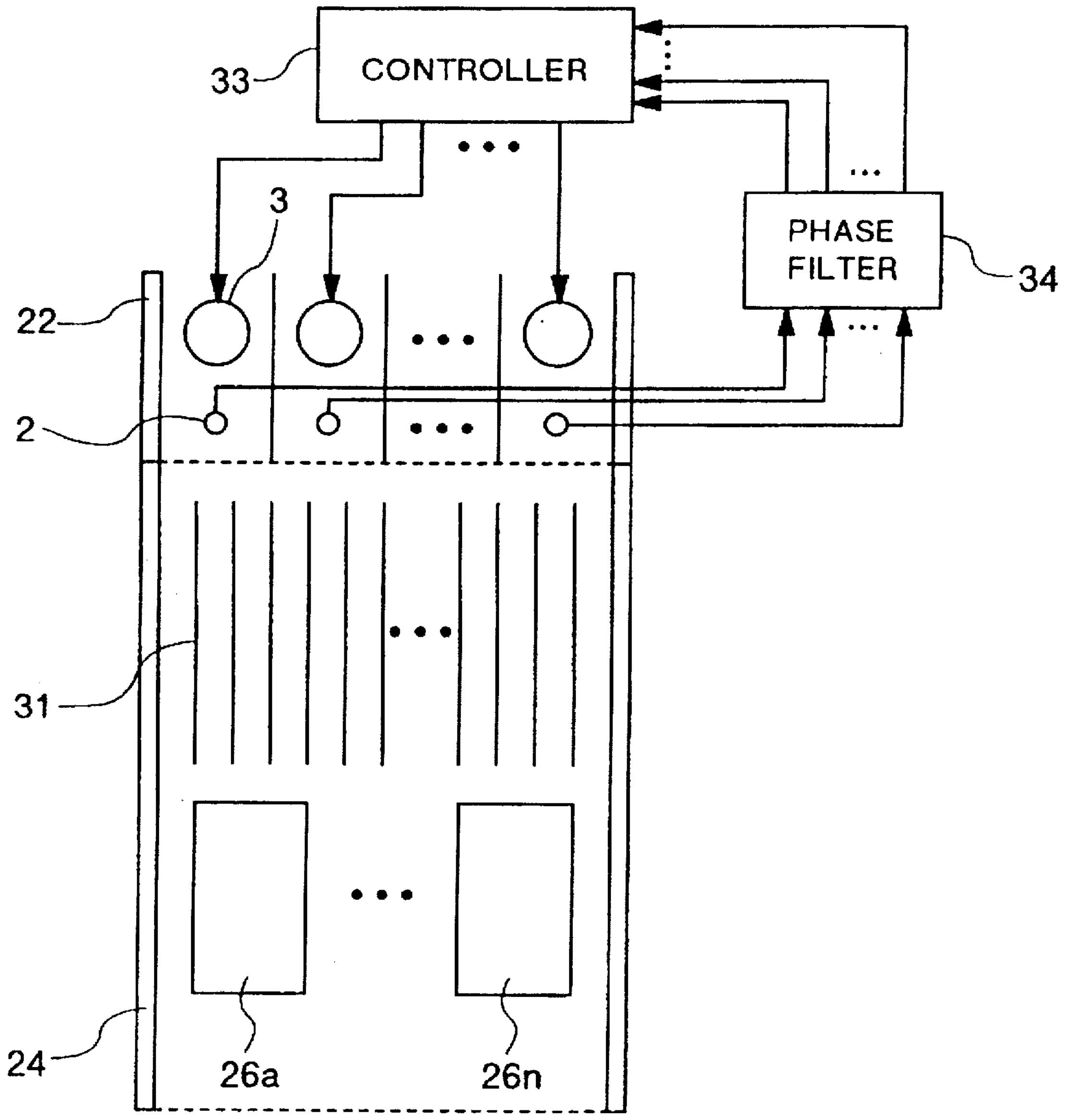
FIG. 16 schematically shows an embodiment in which a phase filter is employed.

FIG. 16 schematically shows an active noise-reduction control apparatus according to another embodiment of the present invention. The same reference numerals shown in FIG. 15 are employed as those for indicating the same constructive devices in FIG. 16. Reference numeral 34 is a phase shifter with a gain of one capable of shifting only a phase. The mechanism for producing noises is identical to that of FIG. 15.

In accordance with the active noise-reduction control method, the reference signal having a high relationship to the noises is detected by the reference sensor 2 provided in each of a plurality of sound propagation paths 22, and the phase of this reference signal detected by each of the plural sound propagation paths is shifted by the phase shifter 34, so that an arbitrary transfer phase characteristic is given to the reference signal. Based upon the reference signal, to which the above-described arbitrary transfer phase characteristic has been given, a noise-reduction signal used to reduce the noises at the respective places in the plural sound propagation paths is formed by the controller 33 in a similar manner to that of FIG. 15. Next, the noise-reduction signal outputted from the controller 33 may cause acoustic waves for reducing noises to be produced in each of the plural sound propagation paths 22 from the speaker 3 provided at each place of the plural sound propagation paths 22, so that destroying interference may occur with the noises which are propagated through the plurality of sound propagation paths 22. Since the control of this phase characteristic can be realized by even an analog type electronic circuit, the signal processing operation effected in the controller 33 may be performed by the analog method. As a result, since no longer such analog-to-digital converter and high speed calculation processor are required, the active noise-reduction controlling apparatus can be made compact with low cost because ultra-highspeed calculation as the feature of the analog type apparatus is available. The active noise-reduction operation is carried out in accordance with the above-described operations, so that the noises leaked from the housing 24 can be lowered. It should be noted that although the transfer phase characteristic is given to the reference signal in the above-described embodiment, such an arrangement capable of simultaneously applying this transfer phase characteristic and the transfer amplitude characteristic may be covered by the inventive idea of the present invention.

Figure 17:
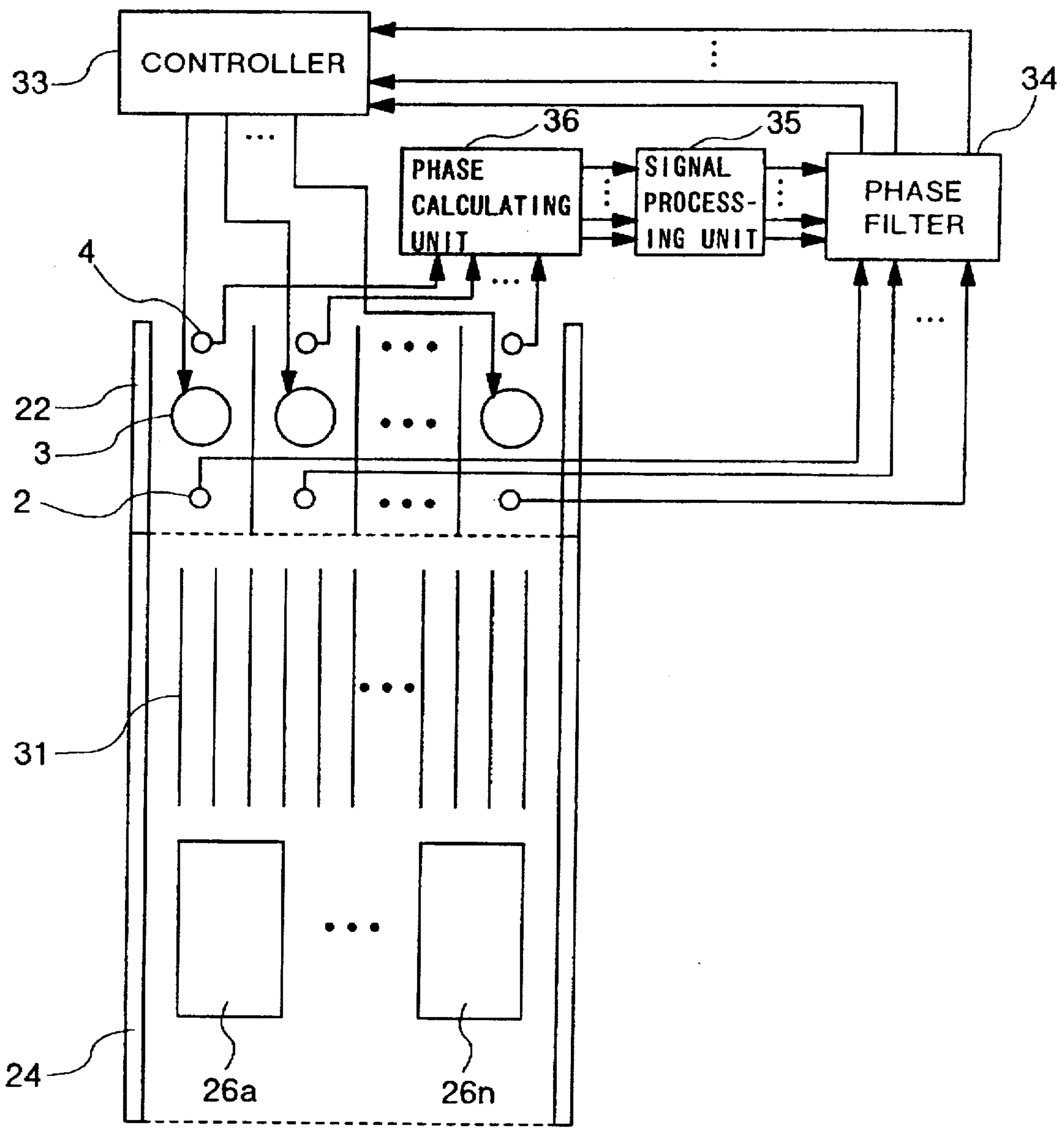
FIG. 17 schematically indicates an embodiment in which a phase calculating unit is employed in the circuit of FIG. 16.

FIG. 17 schematically shows an active noise-reduction control apparatus according to another embodiment of the present invention. The same reference numerals shown in FIG. 15 and FIG. 16 are employed as those for indicating the same constructive devices in FIG. 17. Reference numeral 4 is a noise-reduction error sensor, reference numeral 36 denotes a phase calculating unit, and reference numeral 35 indicates a signal processing unit. The noise-reduction error sensor 4 may be covered with a cover through which cooling air does not pass, but acoustic waves can pass.

In accordance with the active noise-reduction control method, the reference signal having a high relationship to the noises is detected by the reference sensor 2 provided in each of a plurality of sound propagation paths 22, and an arbitrary transfer phase characteristic is given to the reference signal detected in each of the plural sound propagation paths 22. Based upon the reference signal to which the above-described arbitrary transfer phase characteristic has been given, a noise-reduction signal used to reduce the noises at the respective places in the plural sound propagation paths is formed by the controller 33. Next, the noise-reduction signal outputted from the controller 33 may cause acoustic waves for reducing noises to be produced in each of the plural sound propagation paths 22 from the speaker 3 provided at each place of the plural sound propagation paths 22, so that destroying interference may occur with the noises which are propagated through the plurality of sound propagation paths 22. At this time, a noise-reduction error for each of the sound propagation paths is detected by the noise-reduction error sensor 4 which is provided one by one in these plural sound propagation paths 22. Based on a noise-reduction error signal outputted from the noise-reduction error sensor 4, a calculation is performed for a phase delay of a noise-reducing acoustic wave produced from the speaker 3 at the place by the phase calculating unit 36. That is, a phase delay with respect to the phase delay required to cancel the noise is calculated.

Subsequently, based upon the phase delay signal outputted from the phase calculating unit 36, the transfer phase characteristic of the phase filter 34 is varied by the signal processing unit 35 in such a manner that the above-described noise-reduction error becomes small. For instance, a switched capacitor filter is employed as the phase filter 34, and the sampling frequency of this switch is varied in response to the noise-reduction error signal. With the above-described operation, the ultra-highspeed calculation can be achieved at low cost and the active noise-reduction controlling apparatus can be made compact, which is a merit of the analog type apparatus. In other words, the duct length can be shortened. Furthermore, since the active noise reduction can be adaptively performed, the drawbacks of the analog type apparatus, i.e., poor reliability and amount of noise reduction, can be greatly improved. The noises leaked from the housing 24 can be reduced. It should be noted that although the transfer phase characteristic is given to the reference signal in the above-described embodiment, such an arrangement capable of simultaneously applying this transfer phase characteristic and the transfer amplitude characteristic may be covered by the inventive idea of the present invention.

Figure 18:
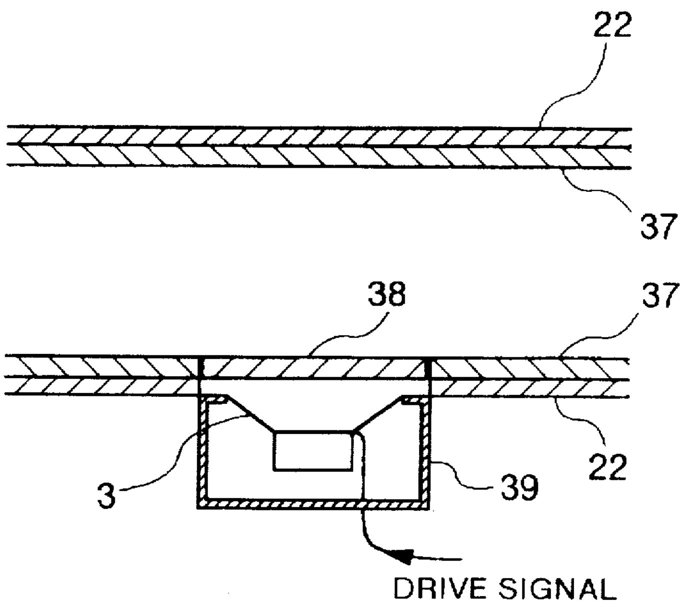
FIG. 18 schematically indicates an embodiment of a speaker mounting condition.

Referring now to FIG. 18, an active noise-reduction controlling apparatus according to another embodiment of the present invention will be described. In FIG. 18, reference numeral 22 indicates a plurality of sound (acoustic) propagation paths, reference numeral 37 denotes a sound absorbing material, reference numeral 39 is a speaker box, reference numeral 3 show a speaker, and reference numeral 38 indicates a speaker cover.

As illustrated in FIG. 18, the speaker box 39, on which the speaker 3 is mounted, is mounted on a hole portion of the plural sound propagation paths 22, whose dimension is equal to the speaker 3 or the speaker box 39. Furthermore, the vibration plane of the speaker 3 is covered by a speaker cover 38 through which the acoustic waves can essentially pass but the cooling air cannot essentially pass in such a manner that this vibration plane of the speaker 3 does not make any stepped portion with respect to the sound absorbing material 37 (no sound absorbing material, if necessary) attached to the inside surfaces of the plural sound propagation paths 22. This arrangement can be employed in the speaker 3 of the respective embodiments of the present invention.

Figure 19:
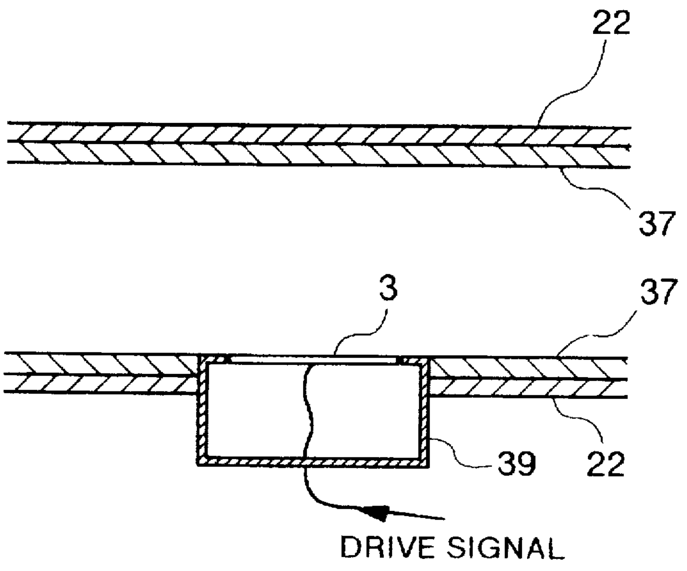
FIG. 19 schematically indicates another embodiment of a speaker mounting condition.

FIG. 19 illustrates another embodiment with employment of a flat speaker as the speaker 3 of FIG. 18.

As shown in FIG. 19, a speaker box 39, on which a flat type speaker 3 is fixed, is mounted on a hole portion of a plurality of sound propagation paths 22, and the hole dimension is equal to the flat type speaker 3, or the speaker box 39. Furthermore, the vibration plane of the flat type speaker 3 is mounted in such a manner that this vibration plane does not substantially make any stepped portion with respect to a sound absorbing member 37 (no sound absorbing member, if necessary.) attached to the inner plane of the plural sound propagation paths 22. As a result, such a problem that coherence is deteriorated by the secondary noises produced from the stepped portion can be solved, and thus a large noise reducing amount can be expected. This arrangement can be employed in the speaker of the respective embodiments. Also, this arrangement may be applied to the reference sensor 2 and the noise-reduction error sensor 4, which is covered by the inventive idea of the present invention.

Figure 20:
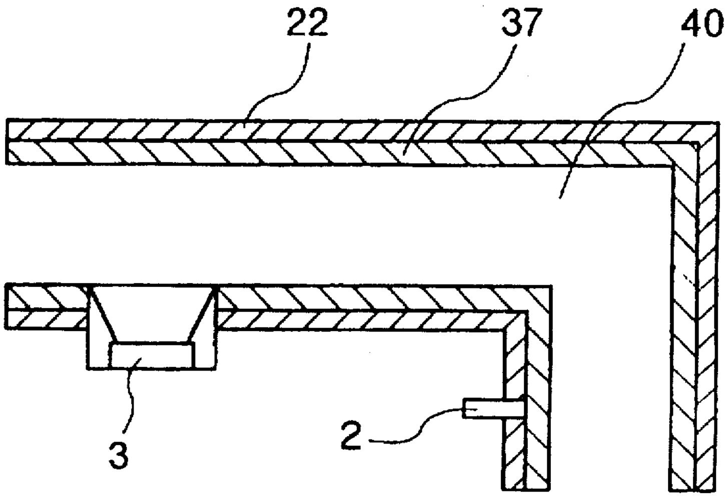
FIG. 20 schematically shows another embodiment in which a bending portion of the acoustic wave propagating path is provided.

In FIG. 20, there is shown an embodiment of the present invention in which a bending portion or corner is provided in a sound (acoustic) propagation path.

As illustrated in FIG. 20, in a plurality of sound propagation paths to which a sound absorbing material 37 (no sound absorbing material, if needed) is attached, a bending propagation path 40 is provided between the reference sensor 2 and the speaker 3. As a result, noises having an intermediate frequency band can be lowered by this bending portion, and also low frequency band noises can be especially reduced by this active noise-reduction controlling apparatus. Such a wide-band noise from the low frequency up to the high frequency can be reduced. Moreover, when a bending duct is provided on the upper portion of the housing in such a manner that the exit direction of this bending duct is positioned substantially parallel to the floor surface on which this housing is installed, the distance measured from the floor surface to the upper surface of the bending duct, namely the height of the electronic apparatus equipped with the active noise-reduction controlling apparatus, can be lowered. In the electronic apparatus equipped with a straight duct having no bending portions, the wind blown from this straight duct collides with the ceiling, resulting in deterioration of cooling performance. With the above-described construction the electronic apparatus can be made compact. This structure is utilized in the plural sound propagation paths employed in the respective embodiments.

Figure 21:
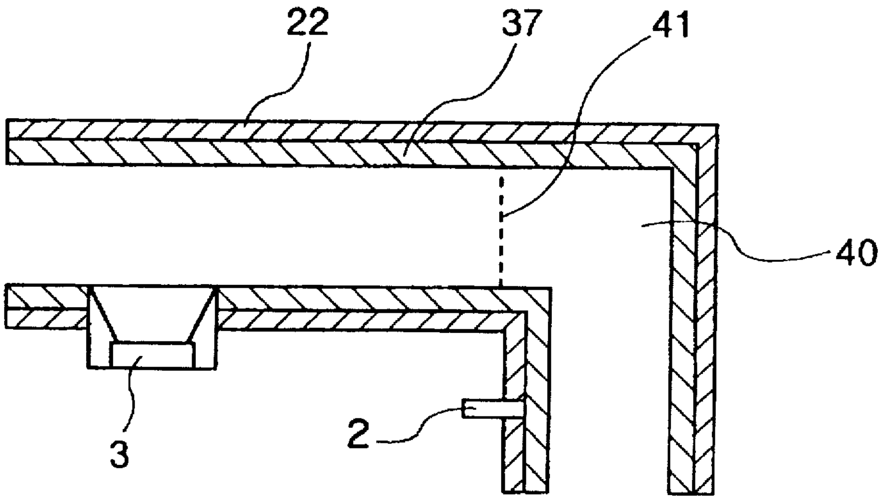
FIG. 21 schematically indicates another embodiment in which a mesh is provided in the acoustic wave propagating path.

In FIG. 21, there is illustrated an embodiment of the present invention, in which a mesh is provided in a sound propagation path to establish a uniform wind speed distribution.

As illustrated in FIG. 21, in a plurality of sound propagation paths 22 to which is applied a sound absorbing member 37 (no sound absorbing member, if necessary), a bending propagation path 40 is provided, for instance, between a reference sensor 2 and a speaker 3. It should be understood that this bending propagation path 40 may not be employed. Furthermore, a mesh 41 is inserted into the sound propagation path, for instance, after the bending path 40, so that the wind speed distribution over the section of the sound propagation path is made uniform as much as possible so as to suppress occurrences of noises. This arrangement is employed in a plurality of sound propagation paths of the respective embodiments.

Figure 22:
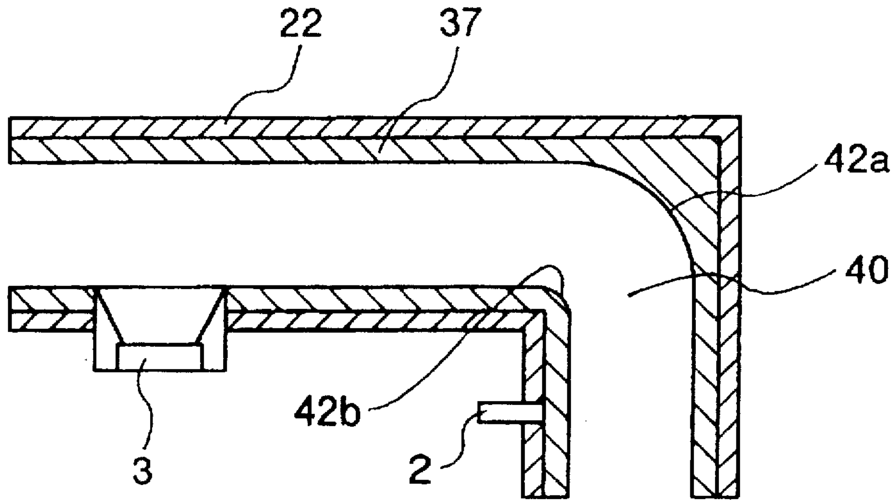
FIG. 22 schematically indicates another embodiment in which the bending portion of the acoustic wave propagating path is made smooth.

FIG. 22 schematically shows an embodiment in which the bending portion of FIG. 20 is made smooth. Smooth corners 42*a* and 42*b* are formed on the inner surfaces of the corners of this bending portion 40. As a consequence, there is no reflection of the acoustic waves directed to the entrance port, so that the acoustic waves can be smoothly outputted to the exit port. This structure is applied to the respective embodiments.

Figure 23:
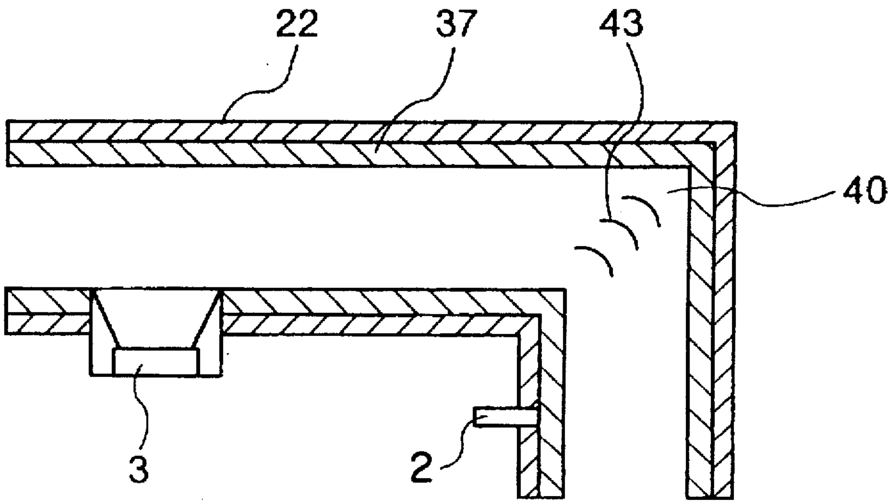
FIG. 23 schematically shows another embodiment in which a straightening vane is provided with the bending portion of the acoustic wave propagating path.

In FIG. 23, there is indicated an embodiment in which a straightening vane is provided within a bending sound propagation path. In this embodiment, a straightening vane 43 is formed at the location of the bending propagation path 40. As a result, since the maximum wind speed produced within the sound propagation path can be lowered, occurrences of secondary sounds within the duct, as well as increases of pressure loss of the duct, can be suppressed. This structure is employed in the bending propagation path portions of the respective embodiment.

Figure 24:
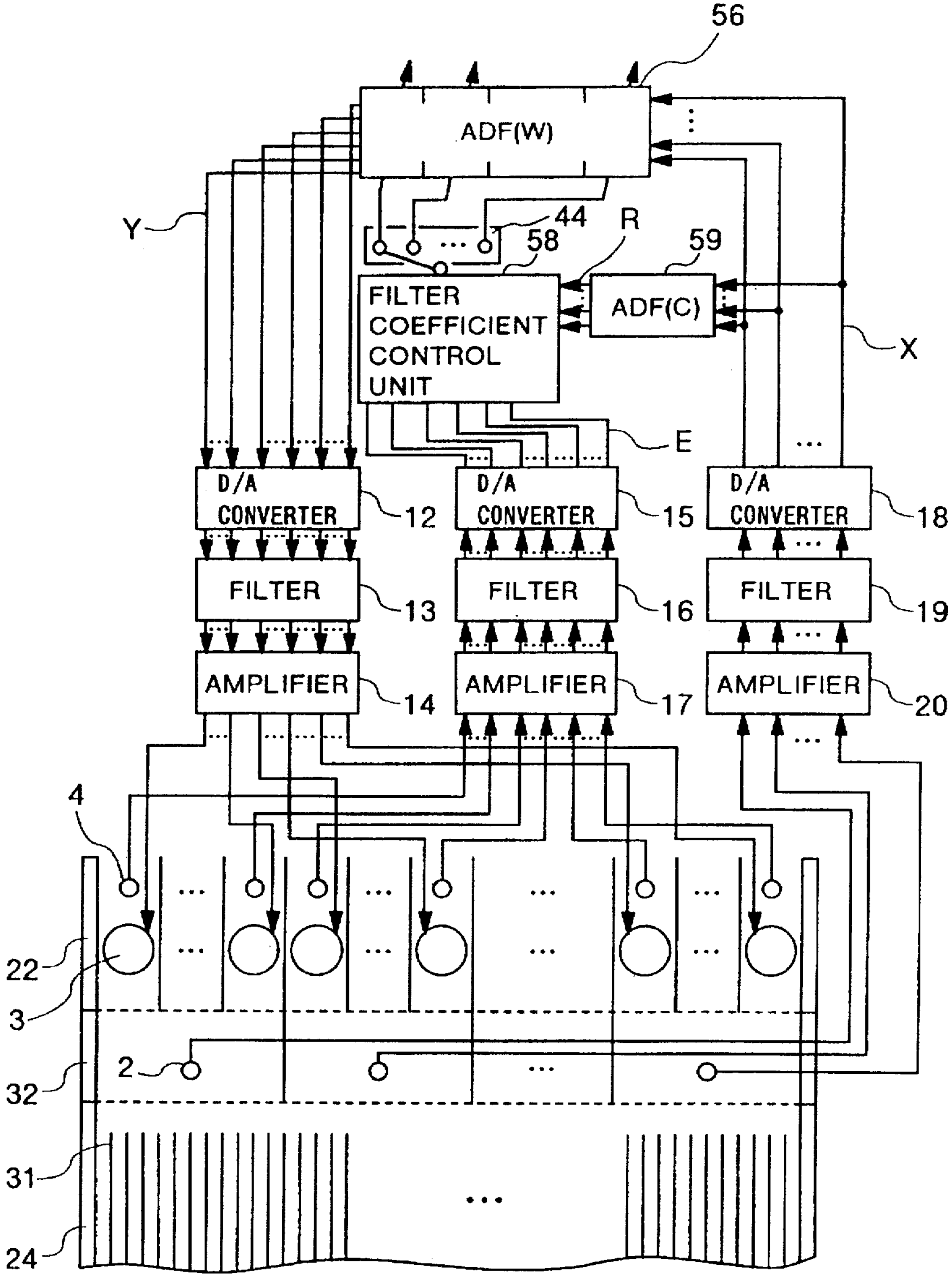
FIG. 24 schematically represents another embodiment in which coefficients of an adaptive digital filter are switched in a unit of block so as to be updated.

In FIG. 24, there is represented another embodiment of the present invention, in which a portion of the filter coefficients of an adaptive digital filter is sequentially updated. It should be noted that the same reference numerals shown in FIG. 1, 9 and 15 are employed as those for indicating the same functional members of this embodiment shown in FIG. 24.

In FIG. 24, reference numeral 24 indicates a housing, reference numeral 31 represents a heating board group, reference numeral 3 is a speaker, reference numeral 2 shows a reference sensor, reference numeral 32 denotes a mixing propagation path, and reference numeral 22 indicates a plurality of sound propagation paths. Reference numeral 4 is a noise-reduction error sensor, reference numeral 20 indicates a reference sensor amplifier, reference numeral 19 denotes a reference sensor filter, reference numeral 18 shows a reference sensor A/D converter, and reference numeral 17 is a noise-reduction error sensor amplifier. Further, reference numeral 16 shows a noise-reduction error sensor filter, reference numeral 15 represents a noise-reduction error sensor A/D converter, reference numeral 14 denotes a speaker amplifier, reference numeral 13 indicates a speaker filter, reference numeral 12 shows a speaker D/A converter, reference numeral 59 indicates an adaptive digital filter ADF(C), reference numeral 58 is a filter coefficient control unit operable in accordance with the LMS algorithm, reference numeral 44 shows a switch, and reference numeral 56 indicates an adaptive digital filter ADF(W).

In accordance with the active noise-reduction control method, a reference signal having a high relationship to the above-explained noises is first detected by the reference sensor 2 which is provided one by one in the each space of the mixing propagation path. This reference signal is amplified by the reference sensor amplifier 20. Then, the amplified reference signal is processed by the reference sensor filter 19 to discriminate only necessary frequency components from the reference signal, which will then be converted into the digital noise data by the reference sensor A/D converter 18. To produce noise-reduction data used to reducing noises occurring in the respective places within the plural sound propagation paths 22, the digital noise data is convolution-calculated in the ADF(W) 56. The noise-reduction data outputted from the ADF(W) 56 is converted into an analog noise-reduction signal by the speaker D/A converter 12. This analog noise-reduction signal is processed through the speaker filter 13 and the speaker amplifier 14, so that acoustic waves for reducing the noises are produced from the speaker 3 provided in each propagation path of the plural sound propagation paths 22, and therefore these acoustic waves may acoustically interfere with the above-mentioned noises which are propagated through the plural sound propagation paths. On the other hand, the noise-reduction error sensor 4 provided in each of the plural sound propagation paths detects a noise-reduction error occurred in the respective places within the plural sound propagation paths 22, and this detected noise-reduction error is processed by the noise-reduction error sensor amplifier 17, the noise-reduction error sensor filter 16, and the noise-reduction error sensor A/D converter 15 into digital error data. Based upon both this digital error data and the digital noise data convolution-calculated by the ADF(C) 59, the coefficient of the ADF(W) 56 is updated by the filter coefficient control unit 58. At this time, this coefficient updating operation is carried out in such a manner that the coefficient series of the ADF(W) 56 are subdivided into a plurality of blocks, these blocks are sequentially selected by way of a switch 44, and then the coefficient updating operation is executed for each of the subdivided blocks. With the above-described operation, the active noise reduction is adaptively performed so that the noises leaked from the housing 24 can be reduced.

Figure 25:
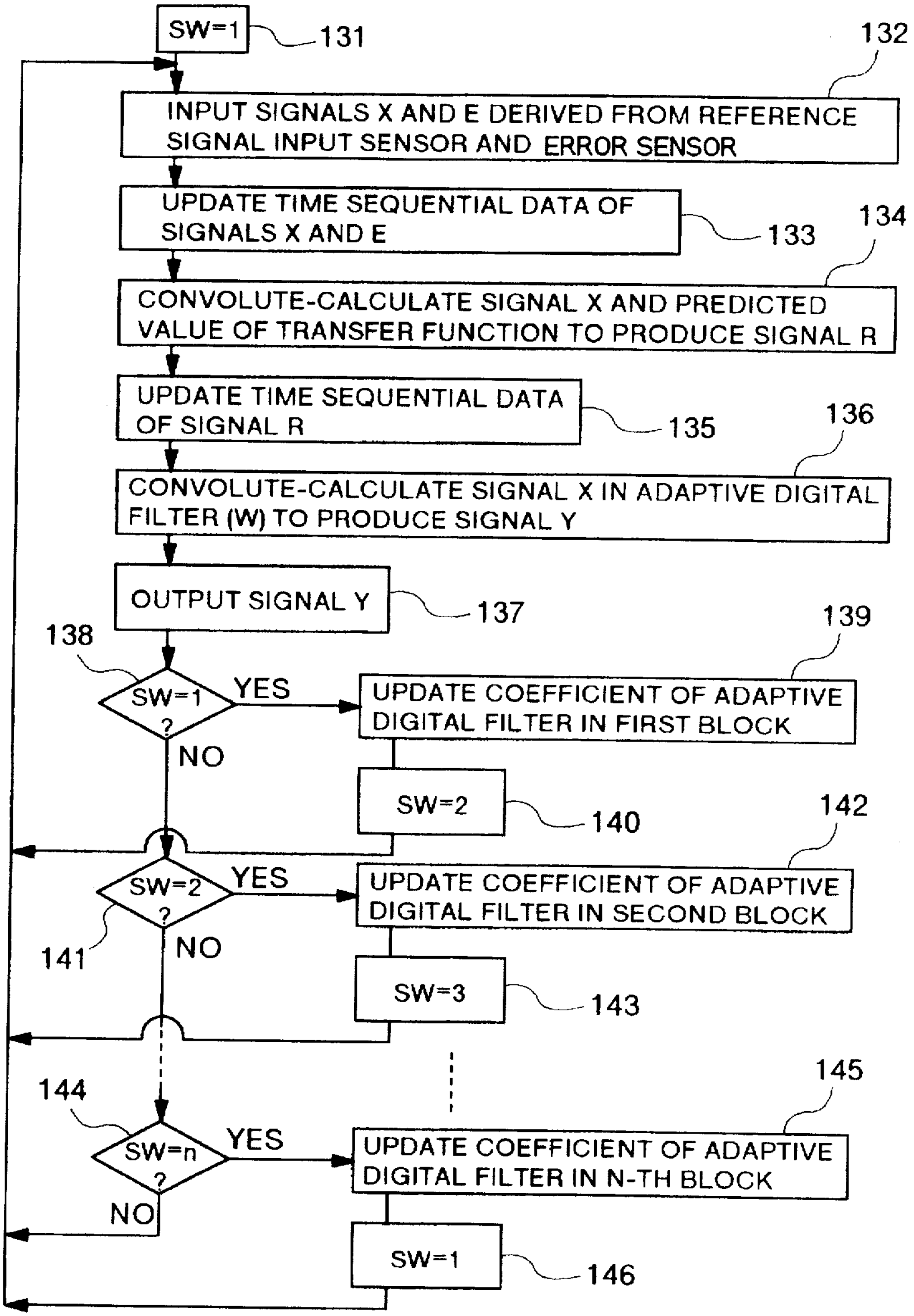
FIG. 25 is a flow chart for explaining an updating operation of the filter coefficient of FIG. 24.

FIG. 25 is a flow chart for updating the coefficient of FIG. 24.

First, a designation is made of the first block of the ADF(W) 56 by using the switch 44 (step 131). Next, both the signal X and the signal E derived from the reference sensor 2 and the noise-reduction error sensor 4 are inputted (step 132) to update the time sequential data of these signals X and E (step 133). This signal X of the reference sensor 2 is convolution-calculated by the ADF(C) 59 to produce a virtual input signal R (step 134), so that the time sequential data of this virtual input signal R is updated (step 135). Also, the signal X of the reference sensor 2 is convolution-calculated by the ADF(W) 56 to form a signal Y (step 136), and output this signal Y (step 137). A check is done as to whether or not the first block of the ADF(W) 56 is selected (step 138). If YES, then the filter coefficient of the first block is updated (step 139) and the second block of the filter coefficient of the ADF(W) 56 is selected (step 140), and thereafter the process operation is returned to the step 132. At steps 141 and 142, the coefficient of the second block of the ADF(W) 56 is updated, and the third block of the filter coefficient of the ADF(W) 56 is selected at a step 143, and then the process operation is returned to a step 132.

Every time the process operations defined at the steps 132 to 137 are repeated, the filter coefficients of the ADF(W) 56 are sequentially updated in a block. At steps 144 and 145, the filter coefficient of the n-th block is updated, and the process operation is returned to the step 132 after the first block has been selected at the step 146. Then, the filter coefficient of the first block is updated.

Alternatively, according to the coefficient updating method, a plurality of ADF(W) 56 whose quantity is equal to the quantity of speakers 3 are subdivided into plural blocks, and the coefficient is updated for each block, so that the calculation amount may be distributedly performed.

Also, in the previous embodiment of FIG. 24, the threshold value "ϵ" is provided with the amplitude value of the coefficient, and the coefficients smaller than this threshold value ϵ are set to O and the coefficients equal to and larger than the threshold valve ϵ are made valid, so that the tap number (quantity of coefficient) may be reduced to lower the calculation amount.

Figure 26:
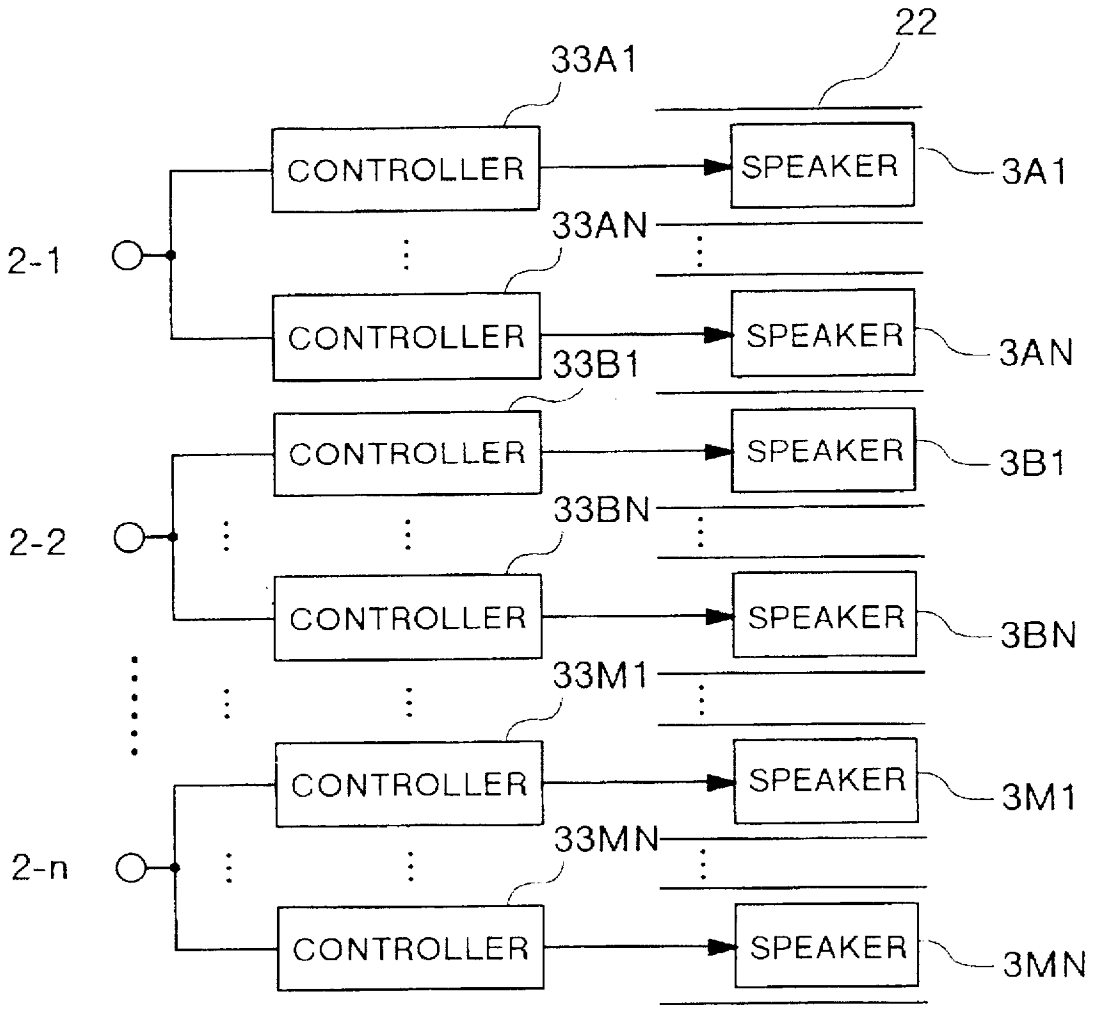
FIG. 26 schematically illustrates the relationship between a reference sensor and a speaker.

FIG. 26 represents an embodiment of the present invention in which a reference sensor for detecting noise is commonly used in a plurality of acoustic wave propagation paths, and the active noise-reduction control is carried out in each of these acoustic wave propagation paths. In FIG. 26, reference numerals 2-1 to 2-n indicate reference sensors, and reference numerals 33A1 to 33MN are output controllers for outputting an active noise-reduction signal within the respective acoustic wave propagation paths 22. Reference numerals 3A1 to 3MN show speakers employed in the respective acoustic wave propagation paths 22. The reference sensor 2-1 is provided for the respective speakers 3A1 to 3AN located at the nearest positions on the acoustic wave propagation path. This positional relationship is similarly applied to other cases. The reference sensor 2-2 is provided for the speakers 3B1 to 3BN located at the nearest positions on the acoustic wave propagation path, whereas the reference sensor 2-n is provided for the speakers 3M1 to 3MN located at the nearest positions on the acoustic wave propagation path.

Based upon the reference signal of the reference sensor 2-1, the signal process is carried out by the controllers 33A1 to 33AN, and the acoustic waves for reducing the noises are produced from the speakers 3A1 to 3AN. Also, based on the reference signal of the reference sensor 2-2, the signal process is performed by the controllers 33B1 to 33BN, and then the acoustic waves, for reducing the noises are produced from the speakers 3B1 to 3BN. Similarly, based upon the reference signal of the reference sensor 2-N, the signal process is carried out by the controllers 33M1 to 33MN, and accordingly, the acoustic waves for reducing the noises are produced from the speakers 3M1 to 3MN. This arrangement is employed in the respective embodiments.

Figure 27:
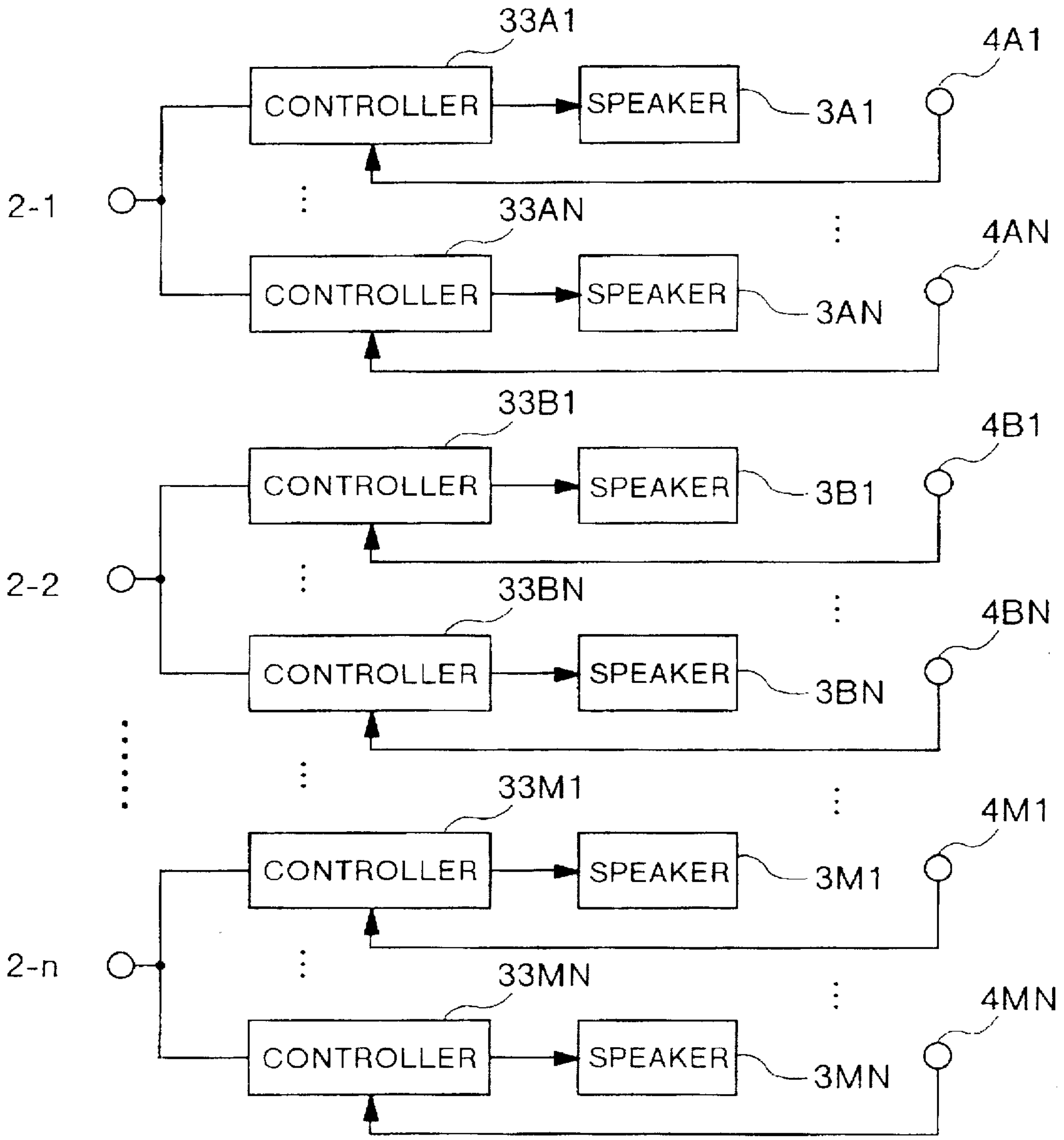
FIG. 27 schematically shows a relationship between the reference sensor, the speaker, and a noise-reduction error sensor.

FIG. 27 schematically shows another embodiment of the present invention in which a noise-reduction error sensor is additionally provided in the previous embodiment of FIG. 26.

In response to the reference signal derived from the reference sensor 2-1, the signal process is carried out in the controllers 33A1 to 33AN, and then the acoustic wave for canceling the noises are produced from the speakers 3A1 to 3AN. At this time, the noise-reduction conditions are detected by the noise-reduction error sensors 4A1 to 4AN to adaptively vary the controllers 33A1 to 33AN, respectively. Based on the reference signal derived from the reference sensor 2-2, the signal process is carried out by the controllers 33B1 to 33BN, and thus the acoustic waves for reducing the noises are produced from the speakers 3B1 to 3BN. The noise-reduction conditions at this time are detected by the noise-reduction sensors 4B1 to 4BN so as to vary the controllers 33B1 to 33BN in the adaptive manner. Similarly, based on the reference signal obtained from the reference sensor 2-n, the signal process is carried out by the controllers 33M1 to 33MN, whereby the acoustic waves for reducing the noises are produced from the speakers 3M1 to 3MN. The noise-reduction conditions at this time are detected by the noise-reduction error sensors 4M1 to 4MN so as to adaptively vary the controllers 33M1 to 33MN. This arrangement is employed in the respective embodiments.

It should be noted that the features of each embodiment may be applied to other embodiments, which are apparently covered by the inventive idea of the present invention.

We claim:

1. For use in an active noise-reduction controlling apparatus including a reference sensor for outputting a reference signal corresponding to information about a noise source; a noise-reduction error sensor for detecting a noise-reduction condition; an adding acoustic wave source for producing an acoustic wave having the same amplitude as that of an acoustic wave detected by said noise-reduction error sensor and having a phase opposite to that of said acoustic wave detected by said noise-reduction error sensor; a first adaptive digital filter for processing said reference signal to output a control signal for said adding acoustic wave source; a second adaptive digital filter for setting a predicted value of a transfer function between an input signal of said adding acoustic wave source and an output signal of said noise-reduction error sensor; and filter coefficient controlling means for optimizing a coefficient of said first adaptive digital filter based on said predicted value of the transfer function and the output signal of said noise-reduction error sensor, an active noise-reduction controlling method comprising the steps of:

(a) detecting an environmental change; and (b) correcting said predicted value of the transfer function when the detected environmental change is greater than a predetermined value, wherein step (a) includes obtaining a difference between coefficient values of said first adaptive digital filter which are detected during a noise-reduction operation.

2. For use in an active noise-reduction controlling apparatus including a reference sensor for outputting a reference signal corresponding to information about a noise source; a noise-reduction error sensor for detecting a noise-reduction condition; an adding acoustic wave source for producing an acoustic wave having the same amplitude as that of an acoustic wave detected by said noise-reduction error sensor and having a phase opposite to that of said acoustic wave detected by said noise-reduction error sensor; a first adaptive digital filter for processing said reference signal to output a control signal for said adding acoustic wave source; a second adaptive digital filter for setting a predicted value of a transfer function between an input signal of said adding acoustic wave source and an output signal of said noise-reduction error sensor; and filter coefficient controlling means for optimizing a coefficient of said first adaptive digital filter based on said predicted value of the transfer function and the output signal of said noise-reduction error sensor, an active noise-reduction controlling method comprising the steps of:

(a) detecting an environmental change; and (b) correcting said predicted value of the transfer function when the detected environmental change is greater than a predetermined value, wherein step (b) includes changing a tap quantity used to set the predicted value of said transfer function by setting a threshold value to a level of the transfer function and by making a tap of a filter coefficient effectively corresponding to the transfer function larger than said threshold value.

3. An active noise-reduction controlling apparatus comprising:

a reference sensor for outputting a reference signal corresponding to information about a noise source;

a noise-reduction error sensor for detecting a noise-reduction condition;

an adding acoustic wave source for producing an acoustic wave having the same amplitude as that of an acoustic wave detected by said noise-reduction error sensor and having a phase opposite to that of said acoustic wave detected by said noise-reduction error sensor, said adding acoustic wave source being arranged in a flat form;

a first adaptive digital filter for processing said reference signal to output a control signal for said adding acoustic wave source;

a second adaptive digital filter for setting a predicted value of a transfer function between an input signal of said adding acoustic wave source and an output signal of said noise-reduction error sensor;

filter coefficient controlling means for optimizing a coefficient of said first adaptive digital filter based on the predicted value of the transfer function and the output of said noise-reduction error sensor;

means for detecting an environmental change; and means for correcting said predicted value of the transfer function when the detected environmental change is greater than a predetermined value, wherein said means for detecting the environmental change includes:

means for detecting the output values of said noise-reduction error sensor at different times during a noise-reduction operation; and means for calculating a difference between absolute values of the detected output values of said noise-reduction error sensor.

4. An active noise-reduction controlling apparatus comprising:

a reference sensor for outputting a reference signal corresponding to information about a noise source;

a noise-reduction error sensor for detecting a noise-reduction condition;

an adding acoustic wave source for producing an acoustic wave having the same amplitude as that of an acoustic wave detected by said noise-reduction error sensor and having a phase opposite to that of said acoustic wave detected by said noise-reduction error sensor;

a first adaptive digital filter for processing said reference signal to output a control signal for said adding acoustic wave source;

a second adaptive digital filter for setting a predicted value of a transfer function between an input signal of said adding acoustic wave source and an output signal of said noise-reduction error sensor;

filter coefficient controlling means for optimizing a coefficient of said first adaptive digital filter based on the predicted value of the transfer function and the output of said noise-reduction error sensor;

means for detecting an environmental change; and means for correcting said predicted value of the transfer function when the detected environmental change is greater than a predetermined value, wherein said means for detecting the environmental change includes:

means for detecting coefficient values of said first adaptive digital filter at different times during a noise-reduction operation; and means for obtaining a difference in said coefficient values.

5. An active noise-reduction controlling apparatus comprising:

a reference sensor for outputting a reference signal corresponding to information about a noise source;

a noise-reduction error sensor for detecting a noise-reduction condition;

an adding acoustic wave source for producing an acoustic wave having the same amplitude as that of an acoustic wave detected by said noise-reduction error sensor and having a phase opposite to that of said acoustic wave detected by said noise-reduction error sensor, said adding acoustic wave source being arranged in a flat form;

a first adaptive digital filter for processing said reference signal to output a control signal for said adding acoustic wave source;

a second adaptive digital filter for setting a predicted value of a transfer function between an input signal of said adding acoustic wave source and an output signal of said noise-reduction error sensor;

filter coefficient controlling means for optimizing a coefficient of said first adaptive digital filter based on the predicted value of the transfer function and the output of said noise-reduction error sensor;

means for detecting an environmental change; and means for correcting said predicted value of the transfer function when the detected environmental change is greater than a predetermined value, wherein said means for correcting the predicted value of the transfer function includes means for selecting one of predicted values of plural transfer functions, which have been previously prepared.

6. An active noise-reduction controlling apparatus comprising:

a reference sensor for outputting a reference signal corresponding to information about a noise source;

a noise-reduction error sensor for detecting a noise-reduction condition;

an adding acoustic wave source for producing an acoustic wave having the same amplitude as that of an acoustic wave detected by said noise-reduction error sensor and having a phase opposite to that of said acoustic wave detected by said noise-reduction error sensor;

a first adaptive digital filter for processing said reference signal to output a control signal for said adding acoustic wave source;

a second adaptive digital filter for setting a predicted value of a transfer function between an input signal of said adding acoustic wave source and an output signal of said noise-reduction error sensor;

filter coefficient controlling means for optimizing a coefficient of said first adaptive digital filter based on the predicted value of the transfer function and the output of said noise-reduction error sensor;

means for detecting an environmental change; and means for correcting said predicted value of the transfer function when the detected environmental change is greater than a predetermined value, wherein said means for correcting the predicted value of the transfer function includes means for changing a tap quantity used to set a predicted value of said transfer function by setting a threshold value to a level of the transfer function and by making a tap of a filter coefficient effectively corresponding to a transfer function larger than said threshold value.

7. An active noise-reduction controlling apparatus comprising:

a reference sensor for outputting a reference signal corresponding to information about a noise source;

a noise-reduction error sensor for detecting a noise-reduction condition;

an adding acoustic wave source for producing an acoustic wave having the same amplitude as that of an acoustic wave detected by said noise-reduction error sensor and having a phase opposite to that of said acoustic wave detected by said noise-reduction error sensor, said adding acoustic wave source being arranged in a flat form;

a first adaptive digital filter for processing said reference signal to output a control signal for said adding acoustic wave source;

a second adaptive digital filter for setting a predicted value of a transfer function between an input signal of said adding acoustic wave source and an output signal of said noise-reduction error sensor;

filter coefficient controlling means for optimizing a coefficient of said first adaptive digital filter based on the predicted value of the transfer function and the output of said noise-reduction error sensor;

means for detecting an environmental change; and means for correcting said predicted value of the transfer function when the detected environmental change is greater than a predetermined value, wherein said means for detecting the environmental change includes temperature detecting means.

8. An active noise-reduction controlling apparatus comprising:

a reference sensor for outputting a reference signal corresponding to information about a noise source;

means defining a plurality of acoustic wave propagation paths by subdividing an air duct unit;

a plurality of noise-reduction error sensors provided in respective ones of the acoustic wave propagation paths, for detecting noise-reduction conditions;

a plurality of adding acoustic wave sources provided in respective ones of the acoustic wave propagation paths, each adding acoustic wave source controlled to produce an acoustic wave having the same amplitude as that of an acoustic wave detected by a corresponding one of said noise-reduction error sensors and having a phase opposite to that of said acoustic wave detected by said corresponding one of said noise-reduction error sensors;

a plurality of first adaptive digital filters for processing said reference signal to output control signals for respective ones of said adding acoustic wave sources;

a plurality of second adaptive digital filters, each second adaptive digital filter setting a predicted value of a transfer function between an input signal of a corresponding one of said adding acoustic wave sources and an output signal of at least one of said plurality of noise-reduction error sensors in correspondence with said corresponding one of said adding acoustic wave sources; and a plurality of filter coefficient controlling means for optimizing coefficients of said first adaptive digital filters based on said predicted values of the transfer functions and the output signal of at least one of said plurality of noise-reduction error sensors.

9. An active noise-reduction controlling apparatus as claimed in claim 8, further comprising:

means for detecting an environmental change; and means for correcting the predicted values of said transfer functions when the detected environmental change is greater than a predetermined value.

10. An active noise-reduction controlling apparatus comprising:

a reference sensor for outputting a reference signal corresponding to information about a noise source;

means defining a plurality of acoustic wave propagation paths by subdividing an air duct unit;

a plurality of noise-reduction error sensors provided in respective ones of the acoustic wave propagation paths, for detecting noise-reduction conditions;

a plurality of adding acoustic wave sources provided in respective ones of the acoustic wave propagation paths, each adding acoustic wave source controlled to produce an acoustic wave having the same amplitude as that of an acoustic wave detected by a corresponding one of said noise-reduction error sensors and having a phase opposite to that of said acoustic wave detected by said corresponding one of said noise-reduction error sensors;

a plurality of first adaptive digital filters for processing said reference signal to output control signals for respective ones of said adding acoustic wave sources;

a plurality of second adaptive digital filters, each second adaptive digital filter setting a predicted value of a transfer function between an input signal of a corresponding one of said adding acoustic wave sources and an output signal of at least one of said plurality of noise-reduction error sensors in correspondence with said corresponding one of said adding acoustic wave sources;

a plurality of filter coefficient controlling means for optimizing coefficients of said first adaptive digital filter based on said predicted values of the transfer functions and the output signal of at least one of said plurality of noise-reduction error sensors; and means for weighting the output signals from said respective noise-reduction error sensors.

11. An active noise-reduction controlling apparatus comprising:

a reference sensor for outputting a reference signal corresponding to information about a noise source;

means defining a plurality of acoustic wave propagation paths by subdividing an air duct unit;

a plurality of noise-reduction error sensors provided in respective ones of said acoustic wave propagation paths, for detecting noise-reduction conditions;

at least one adding acoustic wave source, each adding acoustic wave source commonly provided in adjacent acoustic wave propagation paths, for producing an acoustic wave having the same amplitude as that of an acoustic wave detected by said noise-reduction error sensors in said adjacent acoustic wave propagation paths, and having a phase opposite to that of said acoustic wave detected by said noise-reduction error sensors in said adjacent acoustic wave propagation paths;

at least one first adaptive digital filter for processing said reference signal to output a control signal for said at least one adding acoustic wave source;

at least one second adaptive digital for setting a predicted value of a transfer function between an input signal of said at least one adding acoustic wave source and an output signal at least one of said plurality of noise-reduction error sensors based on said at least one adding acoustic wave source; and at least one filter coefficient control means for optimizing a coefficient of said at least one first adaptive digital filter based on the predicted value of the transfer function and the output signal of at least one of said plural noise-reduction error sensors.

12. An active noise-reduction controlling apparatus as claimed in claim 11, further comprising:

means for detecting an environmental change; and means for correcting the predicted value of said transfer function when the detected environmental change is greater than a predetermined value.

13. An active noise-reduction controlling apparatus as claimed in claim 10, further comprising:

means for weighting the output signals from said respective noise-reduction error sensors.

14. An active noise-reduction controlling apparatus comprising:

means defining a plurality of acoustic wave propagation paths by subdividing an air duct unit;

a plurality of reference sensors provided in respective ones of said acoustic wave propagation paths, for outputting reference signals corresponding to information about a noise source;

a plurality of noise-reduction error sensors provided in respective ones of said acoustic wave propagation paths, for detecting noise-reduction conditions;

a plurality of adding acoustic wave sources provided in respective ones of said acoustic wave propagation paths, each adding acoustic wave source controlled to produce an acoustic wave having the same amplitude as that of an acoustic wave detected by a corresponding one of said noise-reduction error sensors and having a phase opposite to that of said acoustic wave detected by said corresponding one of said noise-reduction error sensors;

a plurality of first adaptive digital filters for processing said reference signal to output control signals for respective ones of said adding acoustic wave sources;

a plurality of second adaptive digital filters, each second adaptive digital filter setting a predicted value of a transfer function between an input signal of a corresponding one of said adding acoustic wave sources and an output signal of at least one of said plurality of noise-reduction error sensors in correspondence with said corresponding one of said adding acoustic wave sources; and a plurality of filter coefficient control means for optimizing coefficients of said first adaptive digital filters based on the predicted values of the transfer functions and the output signal of at least one of said plurality of noise-reduction error sensors.

15. An active noise-reduction controlling apparatus as claimed in claim 14, further comprising:

means for detecting an environmental change; and means for correcting the predicted values of said transfer functions when the detected environmental change is greater than a predetermined value.

16. An active noise-reduction controlling apparatus as claimed in claim 14, further comprising:

means for weighting the output signals from said respective plurality of noise-reduction error sensors.

17. An active noise-reduction controlling apparatus comprising:

means defining a plurality of acoustic wave propagation paths by subdividing an air duct unit;

a plurality of reference sensors provided in respective ones of said acoustic wave propagation paths, for outputting reference signals corresponding to information about a noise source;

a plurality of noise-reduction error sensors provided in respective ones of said acoustic wave propagation paths, for detecting noise-reduction conditions;

a plurality of adding acoustic wave sources, each adding acoustic wave source commonly provided in adjacent acoustic wave propagation paths, for producing an acoustic wave having the same amplitude as that of an acoustic wave detected by corresponding ones of said noise-reduction error sensors and having a phase opposite to that of said acoustic wave detected by said corresponding ones of said noise-reduction error sensors;

a plurality of first adaptive digital filters for processing said reference signal to output control signals for respective ones of said adding acoustic wave sources;

a plurality of second adaptive digital filters for setting predicted values of transfer functions between input signals of said adding acoustic wave sources and an output signal of at least one of said plural noise-reduction error sensors in correspondence with said respective ones of said adding acoustic wave sources; and a plurality of filter coefficient control means for optimizing coefficients of said first adaptive digital filters based on said predicted values of the transfer functions and the output signal of at least one of said plural noise-reduction error sensors.

18. An active noise-reduction controlling apparatus as claimed in claim 17, further comprising:

means for detecting an environmental change; and means for correcting the predicted values of said transfer functions when the detected environmental change is greater than a predetermined value.

19. An active noise-reduction controlling apparatus as claimed in claim 17, further comprising:

means for weighting the output signals from said plurality of noise-reduction error sensors.

20. An active noise-reduction controlling apparatus comprising:

means defining a plurality of acoustic wave propagation paths by subdividing an air duct unit;

a plurality of reference sensors, each reference sensor provided in adjoining ones of said plural acoustic wave propagation paths, for outputting reference signals corresponding to information about a noise source;

a plurality of noise-reduction error sensors provided in respective ones of said acoustic wave propagation paths, for detecting noise-reduction conditions;

a plurality of adding acoustic wave sources, each adding acoustic wave source controlled to produce an acoustic wave in adjacent ones of said acoustic wave propagation paths, each produced acoustic wave having the same amplitude as that of an acoustic wave detected by a respective one of said noise-reduction error sensors and having a phase opposite to that of said acoustic wave detected by said respective one of said noise-reduction error sensors;

a plurality of first adaptive digital filters for processing said reference signals to output control signals for said adding acoustic wave sources;

a plurality of second adaptive digital filters for setting predicted values of transfer functions between an input signal of said adding acoustic wave sources and an output signal of at least one of said plurality of noise-reduction error sensors in correspondence with said adding acoustic wave sources; and a plurality of filter coefficient control means for optimizing coefficients of said first adaptive digital filters based on said predicted values of the transfer functions and the output signal of at least one of said plural noise-reduction error sensors.

21. An active noise-reduction controlling apparatus as claimed in claim 20, further comprising:

means for detecting an environmental change; and means for correcting the predicted values of said transfer functions when the detected environmental change is greater than a predetermined value.

22. An active noise-reduction controlling apparatus as claimed in claim 20, further comprising:

means for weighting the output signals derived from said respective ones of said noise-reduction error sensors.

23. An electronic apparatus mounting an active noise-reduction controlling apparatus comprising:

a plurality of air blowers;

a housing holding said air blowers, said housing having an input port and an output port;

first means defining a plurality of acoustic wave propagation paths by subdividing an air duct unit adjacent at least one of said input port and said output port;

a plurality of adding acoustic wave sources, each adding acoustic wave source provided in a respective one of said acoustic wave propagation paths for producing an acoustic wave having the same amplitude as that of an acoustic wave detected at a noise-reduction position and having a phase opposite to that of said detected acoustic wave;

second means defining a mixing propagation path provided between either said input port or said output port and said plurality of acoustic wave propagation paths;

a reference sensor for outputting a reference signal corresponding to information about a noise source; and control means for processing said reference signal to produce a signal for driving said adding acoustic sources.

24. An electronic apparatus mounting an active noise-reduction controlling apparatus as claimed in claim 23, wherein said second means defines said mixing propagation path adjacent said air blowing means, and said reference sensor is employed for each of said mixing propagation paths.

25. An electronic apparatus mounting an active noise-reduction controlling apparatus as claimed in claim 24, wherein said control means includes a phase filter for controlling a phase of said reference signal.

26. An electronic apparatus mounting an active noise-reduction controlling apparatus as claimed in claim 25, further comprising a noise-reduction error sensor for detecting a noise-reducing condition with respect to each of said acoustic wave propagation paths, and wherein said control means further includes:

phase delay calculating means for calculating a phase delay for the acoustic wave produced by said adding acoustic wave source; and means for controlling said phase filter based on the calculated phase delay.

27. An electronic apparatus mounting an active noise-reduction controlling apparatus as claimed in claim 23, wherein either said reference sensor or said noise-reduction error sensor includes a cover through which acoustic waves can pass, while air from said air blower does not pass.

28. An electronic apparatus mounting an active noise-reduction controlling apparatus as claimed in claim 17, wherein said adding acoustic wave source is arranged in a flat form.

29. An active noise-reduction controlling apparatus as claimed in claim 6, 8, 14, 17 or 20, wherein each of said adding acoustic wave sources is arranged in a flat form.

30. An electronic apparatus mounting an active noise-reduction controlling apparatus as claimed in claim 23, wherein said acoustic wave propagation path includes a bending portion between at least one of said adding acoustic wave sources and said reference sensor.

31. An electronic apparatus mounting an active noise-reduction controlling apparatus as claimed in claim 18, 21, 24, 27, or 30, wherein said acoustic wave propagation path includes a bending portion between at least one of said adding acoustic wave sources and said reference sensor.

32. An electronic apparatus mounting an active noise-reduction controlling apparatus as claimed in claim 30, wherein said bending portion contains a corner portion having a smooth inner surface.

33. An active noise-reduction controlling apparatus as claimed in claim 31, wherein said bending portion contains a corner portion having a smooth inner surface.

34. An electronic apparatus mounting an active noise-reduction controlling apparatus as claimed in claim 30, wherein said acoustic wave propagation path includes a straightening vane within said bending portion.

35. An active noise-reduction controlling apparatus as claimed in claim 31, wherein said acoustic wave propagation path includes a straightening vane within said bending portion.

36. An electronic apparatus mounting an active noise-reduction controlling apparatus as claimed in claim 33, wherein said acoustic wave propagation path contains a mesh midway thereof.

37. An active noise-reduction controlling apparatus as claimed in claim 18, 21, 24, 27 or 30, wherein said acoustic wave propagation path contains a mesh midway thereof.

38. An electronic apparatus mounting an active noise-reduction controlling apparatus as claimed in claim 26, wherein:

said control means includes:

a first adaptive digital filter for processing said reference signal to output a control signal for said adding acoustic wave sources;

a second adaptive digital filter for setting a predicted value of a transfer function between an input signal of said adding acoustic wave sources and an output signal of said noise-reduction error sensor;

filter coefficient controlling means for optimizing a coefficient of said first adaptive digital filter based on the predicted value of the transfer function and the output of said noise-reduction error sensor; and switch means, for sub-dividing a coefficient of said first adaptive digital filter into a plurality of blocks and for sequentially selecting said plurality of blocks.

39. An electronic apparatus mounting an active noise-reduction controlling apparatus as claimed in claim 36, wherein said phase filter includes a switched capacitor filter.

40. An active noise-reduction controlling apparatus comprising:

a reference sensor for outputting a reference signal corresponding to information about a noise source;

a noise-reduction error sensor for detecting a noise-reduction condition;

an adding acoustic wave source for producing an acoustic wave having the same amplitude as that of an acoustic wave detected by said noise-reduction error sensor and having a phase opposite to that of said acoustic wave detected by said noise-reduction error sensor;

a first adaptive digital filter for processing said reference signal to output a control signal for said adding acoustic wave source;

a second adaptive digital filter for setting a predicted value of a transfer function between an input signal of said adding acoustic wave source and an output signal of said noise-reduction error sensor;

filter coefficient controlling means for optimizing a coefficient of said first adaptive digital filter based on the predicted value of the transfer function and the output of said noise-reduction error sensor; and switch means coupling said filter coefficient controlling means and said first adaptive digital filter, for subdividing a coefficient of said first adaptive digital filter into a plurality of blocks and for sequentially selecting each of said plurality of blocks so as to sequentially optimize the coefficient of said first adaptive digital filter.

41. An active noise-reduction controlling apparatus comprising:

a reference sensor for outputting a reference signal corresponding to information about a noise source;

a noise-reduction error sensor for detecting a noise-reduction condition;

an adding acoustic wave source for producing an acoustic wave having the same amplitude as that of an acoustic wave detected by said noise-reduction error sensor and having a phase opposite to that of said acoustic wave detected by said noise-reduction error sensor;

a first adaptive digital filter for processing said reference signal to output a control signal for said adding acoustic wave source;

a second adaptive digital filter for setting a predicted value of a transfer function between an input signal of said adding acoustic wave source and an output signal of said noise-reduction error sensor;

filter coefficient controlling means for optimizing a coefficient of said first adaptive digital filter based on the predicted value of the transfer function and the output of said noise-reduction error sensor;

switch means coupling said filter coefficient controlling means and said first adaptive digital filter, for subdividing a coefficient of said first adaptive digital filter into a plurality of blocks and for sequentially selecting each of said plurality of blocks so as to sequentially optimize the coefficient of said first adaptive digital filter;

means for detecting an environmental change; and means for correcting the predicted value of said transfer function when the detected environmental change is greater than a predetermined value.

42. An active noise-reduction controlling apparatus as claimed in claim 14, 17, or 20, wherein each of said first adaptive digital filters is connected to one of said reference sensors that is separated from the respective one of said adding acoustic wave sources by the shortest distance on the acoustic wave propagation path.

43. An electronic apparatus mounting an active noise-reduction controlling apparatus as claimed in claim 23, wherein said reference sensor is separated from one of said adding acoustic wave sources by the shortest distance on the acoustic wave propagation path.

44. For use in an active noise-reduction controlling apparatus including a reference sensor for outputting a reference signal corresponding to information about a noise source; a noise-reduction error sensor for detecting a noise-reduction condition; an adding acoustic wave source for producing an acoustic wave having the same amplitude as that of an acoustic wave detected by said noise-reduction error sensor and having a phase opposite to that of said acoustic wave detected by aid noise-reduction error sensor; a first adaptive digital filter for processing said reference signal to output a control signal for said adding acoustic wave source; a second adaptive digital filter for setting a predicted value of a transfer function between an input signal of said adding acoustic wave source and an output signal of said noise-reduction error sensor; and filter coefficient controlling means for optimizing a coefficient of said first adaptive digital filter based on said predicted value of the transfer function and the output signal of said noise-reduction error sensor, an active noise-reduction controlling method comprising the steps of:

setting a threshold value for said predicted value of the transfer function; and changing a tap quantity for setting the predicted value of the transfer function by making taps of filter coefficients corresponding to the transfer function at least equal to said threshold value valid.

* * * * *